(12) United States Patent
Xie et al.

(10) Patent No.: US 7,704,868 B2
(45) Date of Patent: Apr. 27, 2010

(54) FABRICATION OF A MICRO-ELECTROMECHANICAL SYSTEM (MEMS) DEVICE FROM A COMPLEMENTARY METAL OXIDE SEMICONDUCTOR (CMOS)

(75) Inventors: Huikai Xie, Gainesville, FL (US); Khai D. T. Ngo, Blacksburg, VA (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 157 days.

(21) Appl. No.: 11/911,478

(22) PCT Filed: Apr. 11, 2006

(86) PCT No.: PCT/US2006/013564

§ 371 (c)(1),
(2), (4) Date: Oct. 12, 2007

(87) PCT Pub. No.: WO2006/110782

PCT Pub. Date: Oct. 19, 2006

(65) Prior Publication Data

US 2008/0169553 A1     Jul. 17, 2008

Related U.S. Application Data

(60) Provisional application No. 60/670,355, filed on Apr. 12, 2005.

(51) Int. Cl.
*H01L 21/44*     (2006.01)

(52) U.S. Cl. .............. 438/598; 257/E21.627; 257/E21.641; 257/E23.067; 438/637; 438/666; 438/667

(58) Field of Classification Search .......... 257/E21.627, 257/E21.641, E23.067; 438/598, 637, 666, 438/667
See application file for complete search history.

(56) References Cited

U.S. PATENT DOCUMENTS

| 3,881,244 | A | | 5/1975 | Kendall et al. |
| 5,863,835 | A | * | 1/1999 | Yoo et al. .................. 438/666 |
| 6,858,079 | B2 | * | 2/2005 | Norris et al. .................. 117/70 |
| 2004/0017419 | A1 | * | 1/2004 | Lai et al. ...................... 347/20 |
| 2004/0056749 | A1 | | 3/2004 | Kahlmann et al. |
| 2004/0166688 | A1 | | 8/2004 | Xie et al. |

OTHER PUBLICATIONS

Smith et al., Embedded Micromechanical Devices for the Monolithic Integration of MEMS with CMOS, Electron Devices Meeting, Dec. 10-13, 1995, Washington, DC, USA, pp. 609-612.
Pham et al., IC-Compatible Two-Level Bulk Micromachining Process Module for RF Silicon Technology, IEEE Trans on Electron Devices, Pisacataway, NJ, USA, Aug. 8, 2001, vol. 48, No. 8.
Xie et al., Post-CMOS Processing for High-Aspect-Ratio Integrated Silicon Microstructures, J. of Microelectromechanical Systems, vol. 11, No. 2, Apr. 2002.

* cited by examiner

*Primary Examiner*—Matthew C Landau
*Assistant Examiner*—Yu-Hsi Sun
(74) *Attorney, Agent, or Firm*—Thomas, Kayden, Horstemeyer & Risley, LLP

(57) ABSTRACT

Methods of fabricating micro-electromechanical system devices from complementary metal oxide semiconductors (CMOS) are provided.

15 Claims, 24 Drawing Sheets

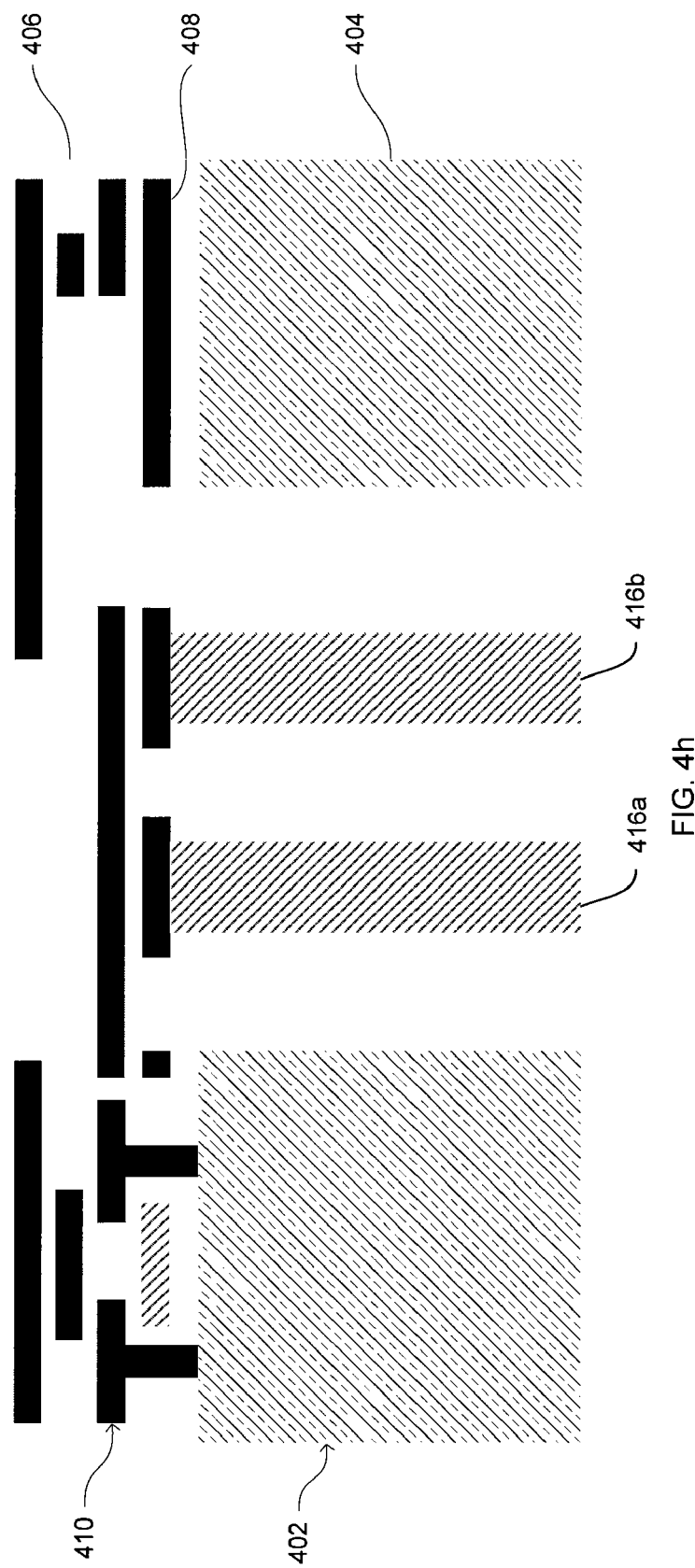

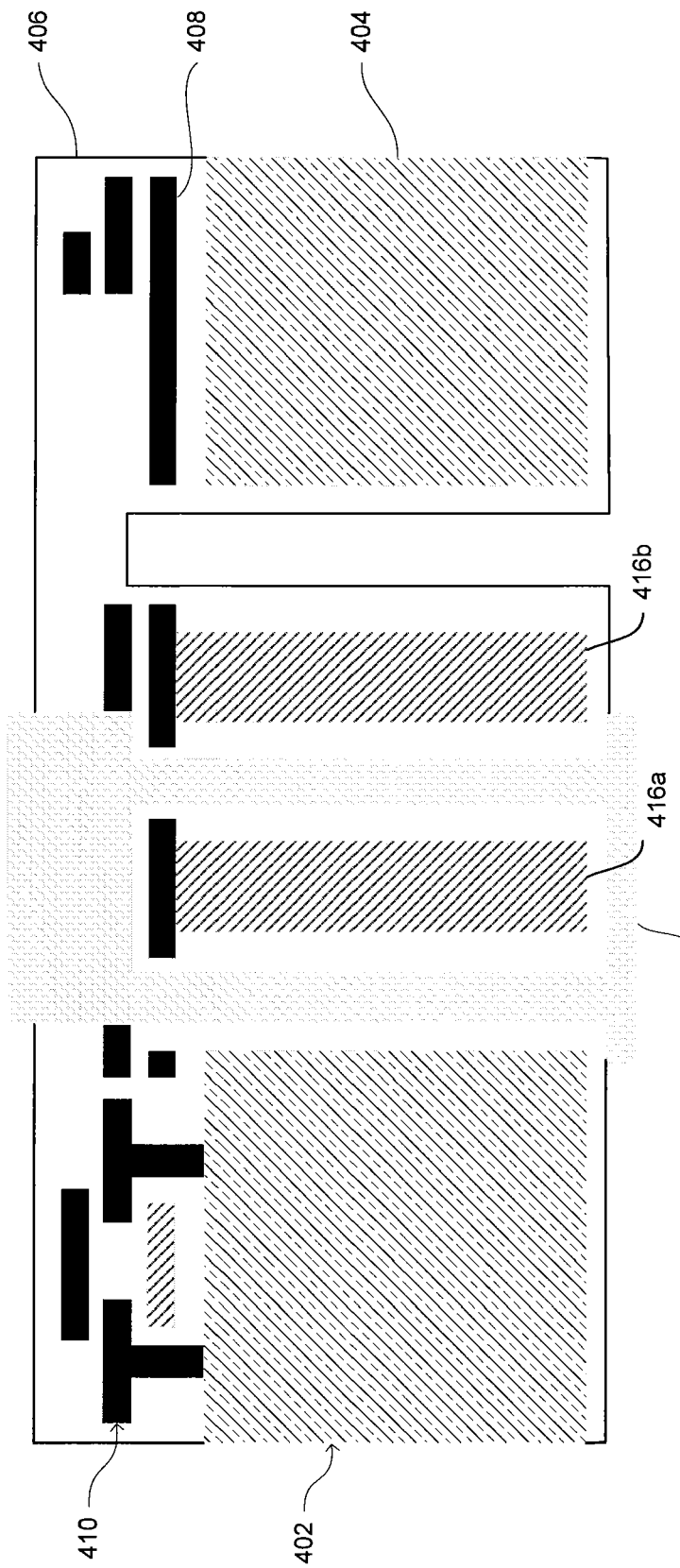

FABRICATION OF A MICRO-ELECTROMECHANICAL SYSTEM (MEMS) DEVICE FROM A COMPLEMENTARY METAL OXIDE SEMICONDUCTOR (CMOS)

CROSS-REFERENCE TO RELATED APPLICATIONS

This application is a §371 national stage entry of International Application No. PCT/US2006/013564, filed Apr. 11, 2006, which claims priority to U.S. Provisional Application No. 60/670,355, filed Apr. 12, 2005, both of which are hereby incorporated by reference.

FIELD OF THE INVENTION

The present invention is related to the field of micro-electromechanical systems (MEMS), and, more particularly, to MEMS fabrication from semiconductor materials.

BACKGROUND

A MEMS device is a blending of integrated circuit (IC) technology with micro-sized mechanical elements. As a result, MEMS devices combine ICs with three-dimensional features and even moving parts. The electronics of a particular MEMS device is typically fabricated using integrated circuit (IC) fabrication techniques, while the micro-mechanical components are typically fabricated using micro-machining processes.

Within the field of MEMS generally, there continues to be a high demand for new "on-chip," planar micro-machined inductors that exhibit high inductance and possess a high quality factor (i.e., the Q-factor or, more simply, Q). The demand has been driven in large part by the advent of magnetic driving MEMS applications, such as magnetic micro-actuators and micro-sensors as well as miniature integrated power converter devices. The requirements for these and similar such devices include small size, low loss, large inductance, high current-carrying capacity, and low fabrication costs.

The goal of devising effective and efficient fabrication techniques for such devices in a planar geometry has proved a difficult challenge, presenting problems that continue to be obstacles to the implementation of low-cost, fully-integrated magnetic MEMS devices. Moreover, utilization of such MEMS devices has been limited due to the relatively low inductance that is conventionally achieved with such devices, the inductance being typically on the order of a few to several hundred nano-henries (nH).

Accordingly, despite numerous MEMS inductor designs, utilization of existing devices continues to be largely confined to high-frequency regimes such as RF and microwave circuits as well as signal processing circuits. This is due to the low inductance, low Q factor, and poor power handling capacity typically exhibited by the conventional devices resulting from conventional fabrication processes.

In accordance with conventional fabrication techniques, MEMS inductors are made by etching a substrate or flipping up to reduce substrate loss. The robustness and high-vibration sensitivity of suspended thin-film inductors fabricated according to these techniques can pose problems, however. Some proposed solutions entail using thick photolithography to create thick conductor layers so as to reduce series resistance, but the stability and reliability of the employed polymers are still concerns. The remaining problem of substrate loss can pose yet another problem.

Conventional techniques, moreover, do not provide for effective and efficient fabrication of power electronic devices, in which inductance usually must be high—in the range of 100 nano-henries (nH) to a few micro-henries ($\mu$H)—and current-carrying capacity typically must be considerable—in the range of 10 Amperes (A). Resistance is typically in the range of a few milliohms (m$\Omega$) range. In addition, conventional fabrication techniques for such devices tend not to be IC compatible. Thus, application-specific ICs and chip-to-chip wire bondings are often needed to effect fabrication of such devices, typically resulting in increased cost and performance degradation.

It follows that there remains a need for effective and efficient processes for fabricating IC-compatible MEMS inductors and similar devices that possess high Q factors, high inductance, and high current-carrying capacity.

SUMMARY OF THE INVENTION

The present invention provides a new process for fabricating MEMS devices from a semiconductor, such as a complementary metal oxide semiconductor (CMOS). More particularly, a bulk silicon microstructure can be used as molding to electroplate a metal such as copper and/or a permalloy in fabricating an inductor or similar device on a CMOS or other semiconductor chip.

The inductor integrated with the CMOS can be fabricated to exhibit a high Q factor and high inductance. A high aspect ratio (HAR) silicon molding can be used to provide thick conducting layers, and, accordingly, low resistance. Moreover, the device can be made using only a limited portion of the available real-estate of a chip. A permalloy can be electrodeposited to form a magnetic core with or without an air gap so as to increase the inductance and Q factor of the inductor. A HAR silicon mold can be fabricated, for example, using deep reactive ion etching (DRIE). The silicon mold is etched after the inductor is formed, which can almost entirely eliminate the substrate loss. Meanwhile, the inductor will be solid or suspended by a uniform membrane. In either case, the inductor is mechanically stable.

A device fabricated according to the present invention has numerous applications. The applications include integrated MEMS inductors and transformers, power inductors, power transformers, and power integrated magnetics, as well as DC/DC converters, AC/DC power converters, and single-chip power converters. Other applications include oscillators and filters. Note, however, that non-power inductors do not necessarily have the same requirements and may require other fabrication processes.

One embodiment of the present invention is a method of fabricating a MEMS device from a CMOS having a silicon layer and an oxide layer, the oxide layer being disposed on the silicon layer and having at least one metal layer disposed therein. The method can include etching the silicon layer of the CMOS to form a trench through the silicon layer to expose a portion of the oxide layer, and depositing a silicon oxide layer on the silicon layer and exposed portion of the oxide layer within the trench. The method additionally can include etching the silicon oxide layer deposited on the exposed portion of the oxide layer to expose a portion of the metal disposed within the oxide layer and electrodepositing a conductor within the trench, the conductor extending through the trench to the exposed portion of the metal. The method further can include etching the silicon layer of the CMOS to remove portions of the silicon layer adjacent the conductor.

Another embodiment of the present invention also is a method of fabricating a MEMS device from a CMOS having a silicon layer and an oxide layer, the oxide layer being disposed on the silicon layer and having a metal disposed therein. The method can include etching the silicon layer of the CMOS to form a trench through the silicon layer to expose a portion of the oxide layer, depositing a silicon oxide layer on the silicon layer and exposed portion of the oxide layer within the trench, and etching the silicon layer deposited on the exposed portion of the oxide layer to expose a portion of the metal disposed within the oxide layer. The method also can include electrodepositing a conductor within the trench, the metal core extending through the trench to the exposed portion of the metal.

The method further can include etching the silicon layer of the CMOS to remove portions of the silicon layer adjacent the conductor, and etching portions of the oxide layer adjacent the conductor to form at least one trench adjacent the conductor defined by sidewalls of the silicon layer on which a layer of oxide remains deposited. Additionally, the method can include forming a dielectric layer over the silicon layer and the conductor, and electrodepositing a permalloy within the at least one trench adjacent the conductor. The method further can include etching the oxide layer to form a trench in a side of the oxide layer opposite the side in which the at least one trench adjacent the conductor is formed to form an opposing side trench, and electrodepositing in the opposing side trench a permalloy.

Yet another embodiment of the present invention is a MEMS device. The MEMS device can include a silicon substrate and an oxide layer disposed on the silicon substrate, the oxide layer containing at least one transistor and at least one conducting layer. The MEMS device further can include at least one conductor that is formed within the silicon substrate and that is connected to the at least one conducting layer.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
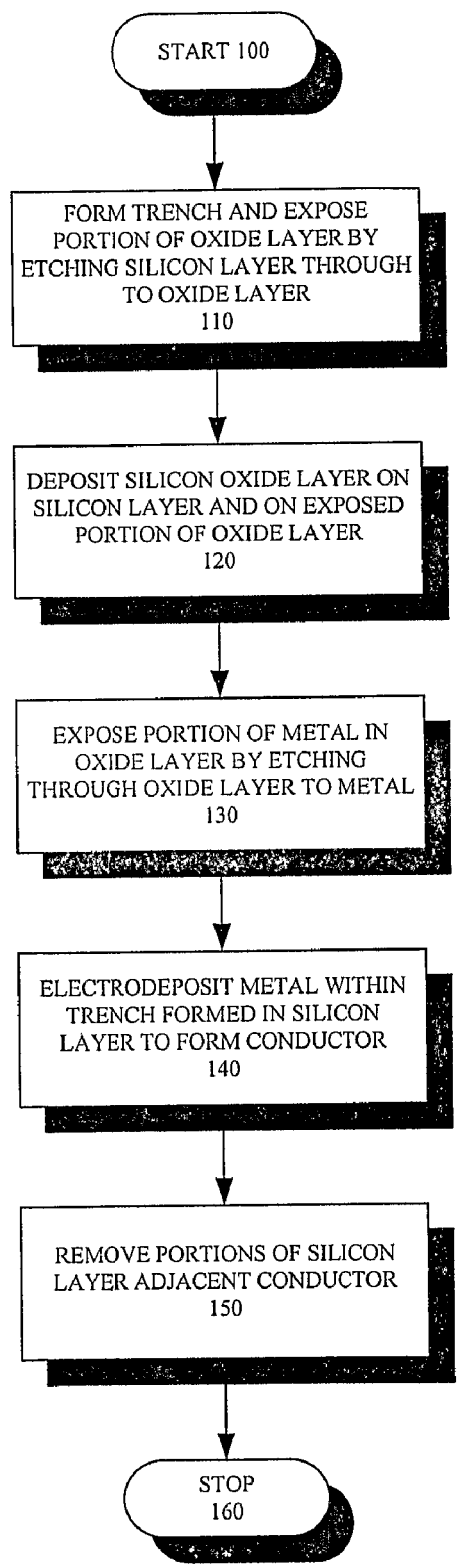
FIG. 1 is a flowchart illustrating a method of fabricating a MEMS device, according to one embodiment of the present invention.

FIG. 1 is a flowchart of the exemplary steps of a method 100 for fabricating a micro-electromechanical system (MEMS) device, according to one embodiment of the present invention. The MEMS device illustratively comprises a MEMS inductor fabricated from a complementary metal oxide semiconductor (CMOS) having a silicon substrate and at least one oxide layer, the at least one oxide layer disposed on the silicon layer and having one or more metal layers disposed therein.

The method illustratively includes, at step 110, etching the silicon substrate of the CMOS to form a trench through the silicon layer to expose a portion of the oxide layer. The method continues at step 120 with the deposition of a silicon oxide layer on the silicon layer and exposed portion of the oxide layer within the trench. Another etching is performed at step 130 to remove portions of the oxide layer deposited on the exposed portion of the oxide layer so as to expose a portion of the metal disposed within the oxide layer. A conductor is fabricated within the trench by electrodepositing a metal therein at step 140, the conductor extending through the trench to the exposed portion of the metal. Yet another etching of the silicon layer of the CMOS is performed at step 160 to remove portions of the silicon layer adjacent the conductor.

Referring additionally now to FIGS. 2a-h, the structure of a MEMS device 200 is illustrated at various points during the process of its fabrication, according to another embodiment of the present invention. The MEMS device 200 is illustratively a MEMS inductor.

Figure 2A:
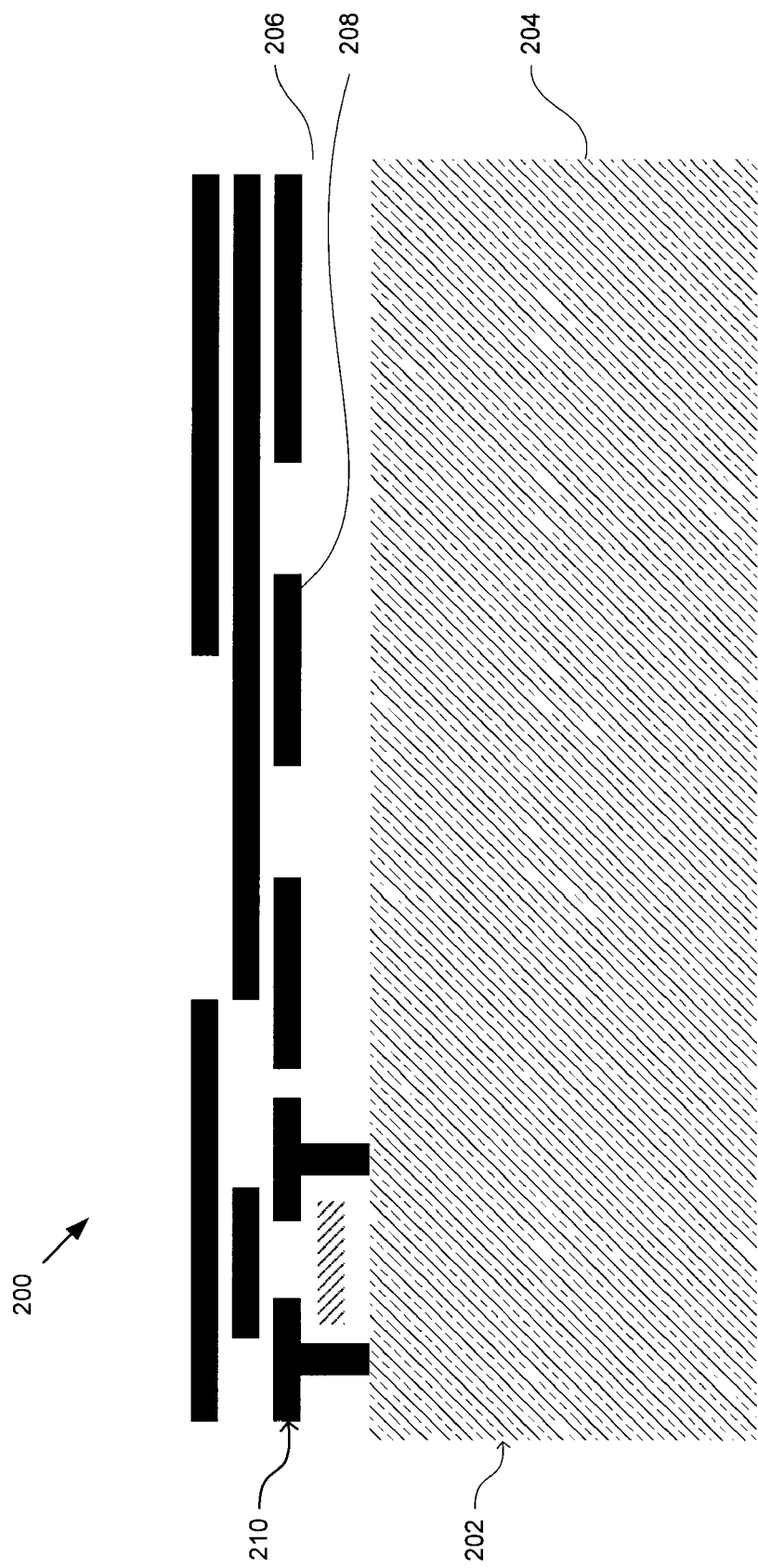
FIGS. 2a-h are schematic diagrams of a cross-sectional portion of a CMOS transformed into a MEMS device, according to another embodiment of the present invention.

FIG. 2a illustrates the CMOS 202 as it is configured at the outset of the exemplary process. The CMOS 202 illustratively includes a silicon layer 204 and an oxide layer 206 disposed on the silicon layer. As further illustrated at least one layer of a metal 208 is disposed within the oxide layer 206. The metal 208 of the at least one layer within the oxide layer 206 can comprise, for example, aluminum.

As will be readily understood by one of ordinary skill in the art, the CMOS comprises a N-channel transistor and a P-channel transistor that operate in a complimentary fashion to achieve small geometries and low power consumption. Only one transistor 210 is illustrated, it being understood that the illustrated transistor can be either an N-channel or P-channel transistor and that the CMOS includes a complementary transistor (not shown).

Figure 2B:
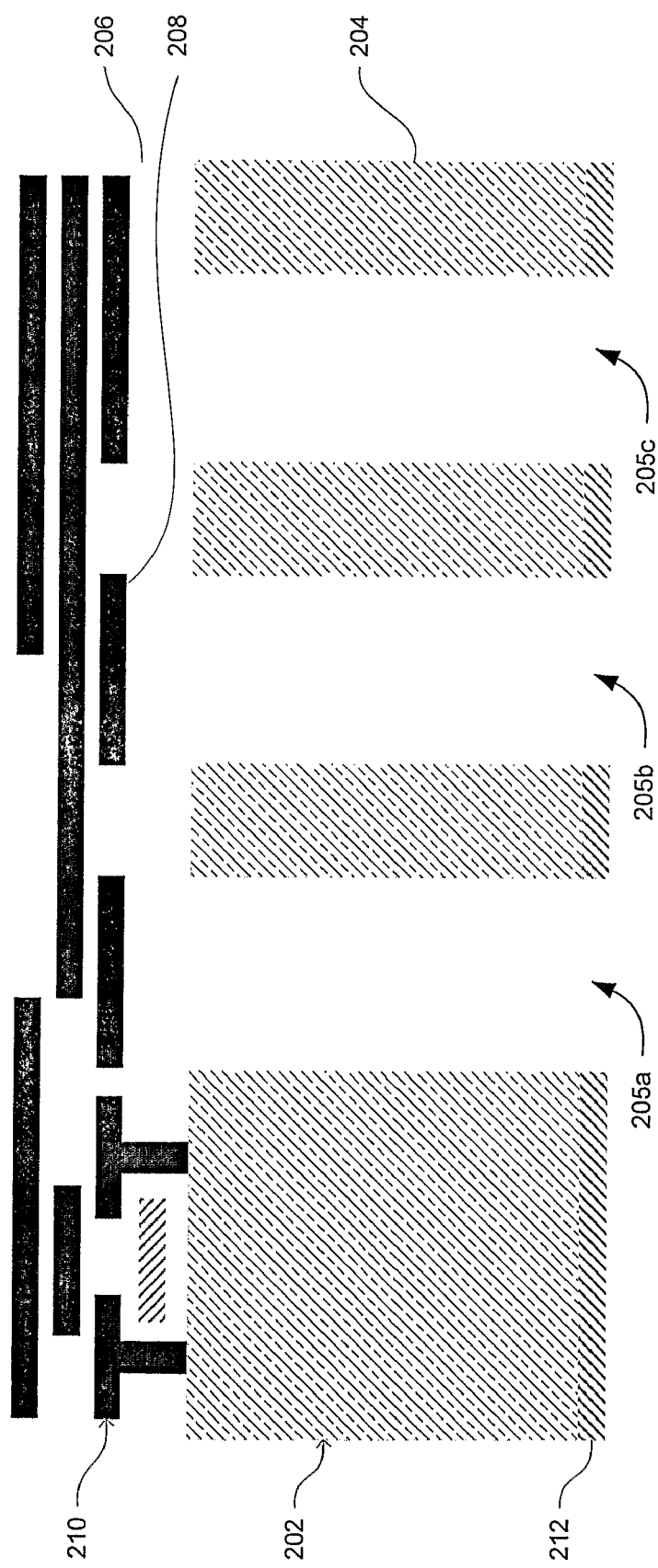

The etching of the silicon layer 204 of the CMOS forms one or more trenches, three being illustratively shown, the exemplary trenches 205a-c extending through the silicon layer 204 to the oxide layer 206 so that the oxide layer is exposed at distal ends of the illustrative trenches. The exemplary trenches 205a-c are shown in FIG. 2b. According to one embodiment, a trench is formed in the silicon layer 204 from the removal of silicon by deep reactive ion etching (DRIE). The positioning of the trenches 205a-c, as will be readily appreciated by one of ordinary skill in the art, can be determined using an etching mask. The etching mask can comprise a thin layer of photosensitive material, a photoresist 212, that is illustratively applied to the exposed side of the silicon layer 204. Alternatively, an oxide or metal layer can be used to form an etching mask, as will also be readily understood by one of ordinary skill in the art.

Figure 2C:
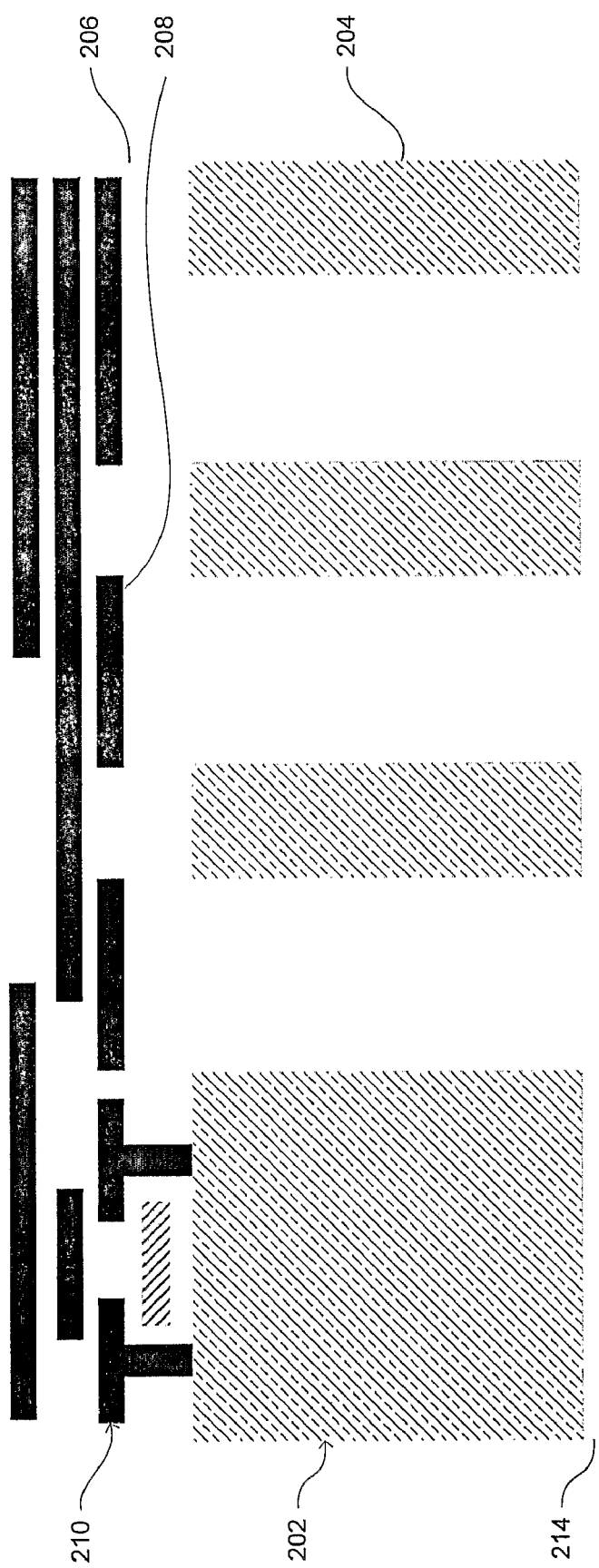

Upon completion of the etching of the silicon layer 204, the photoresist 212 or other etching mask is removed. The etching mask can be removed, for example, using oxygen plasma. After the removal of the photoresist 212 or other etching mask, a silicon oxide layer 214 is deposited on both the silicon layer 204 and the exposed portions of the oxide layer 206 at the distal end of each trench. The result is illustrated in FIG. 2c. According to one embodiment, the silicon oxide layer 214 comprises a deposited thin layer. For example, the silicon oxide layer can, according to one embodiment, have a thickness of approximately 1.0 micrometers (μm). According to still another embodiment, the silicon oxide layer can be deposited using plasma-enhanced chemical vapor deposition (PECVD).

Figure 2D:
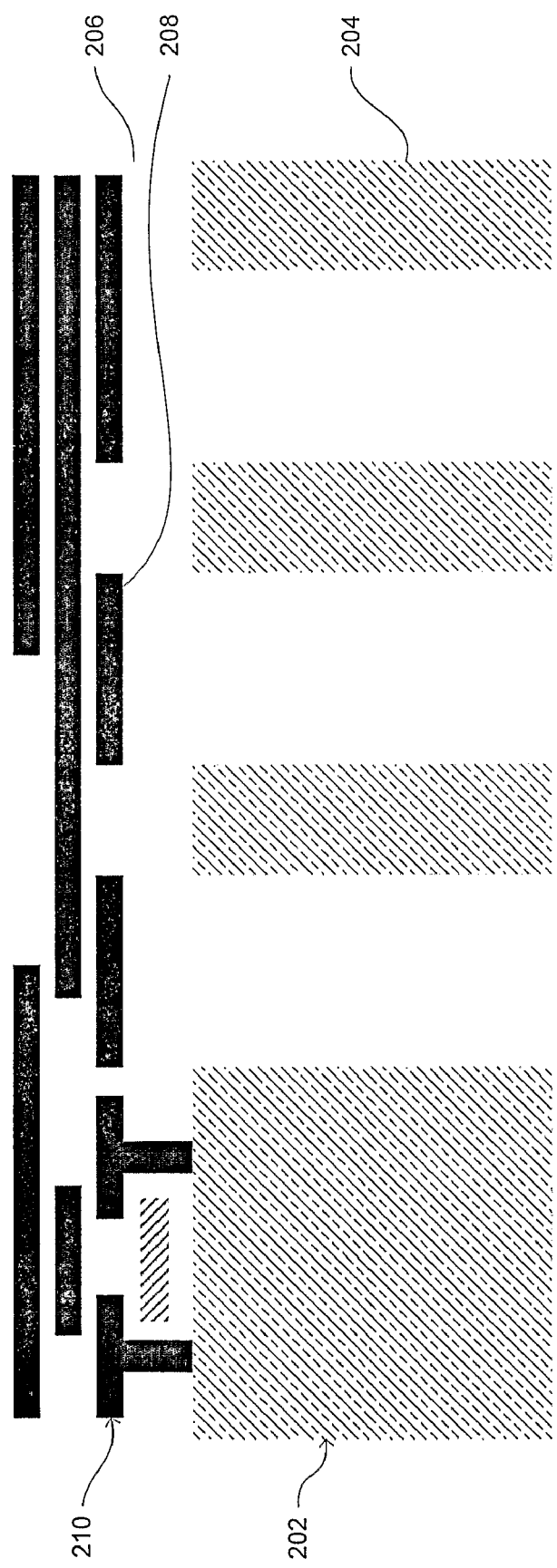

The fabrication of the MEMS device 200 continues with the exposing of a portion of the metal 208 disposed within the oxide layer 206 as illustrated in FIG. 2d. The exposure is illustratively accomplished by removing portions of the oxide layer 206 at each distal end of each trench formed in the oxide layer 206. The removal of these portions of the oxide layer 206 exposes the underlying portions of the metal 208. According to one embodiment, the removal of these portions of the oxide layer 206 is accomplished using an anisotropic dielectric etch. According to another embodiment, the removal can be accomplished with a reactive ion etch (RIE), employing, for example $CHF_3$ and $O_2$. Note that, as illustrated, the sidewalls of the trenches formed by the remaining silicon layer 204 retain the oxide layer deposited thereon due to the directional etching of RIE.

Figure 2E:
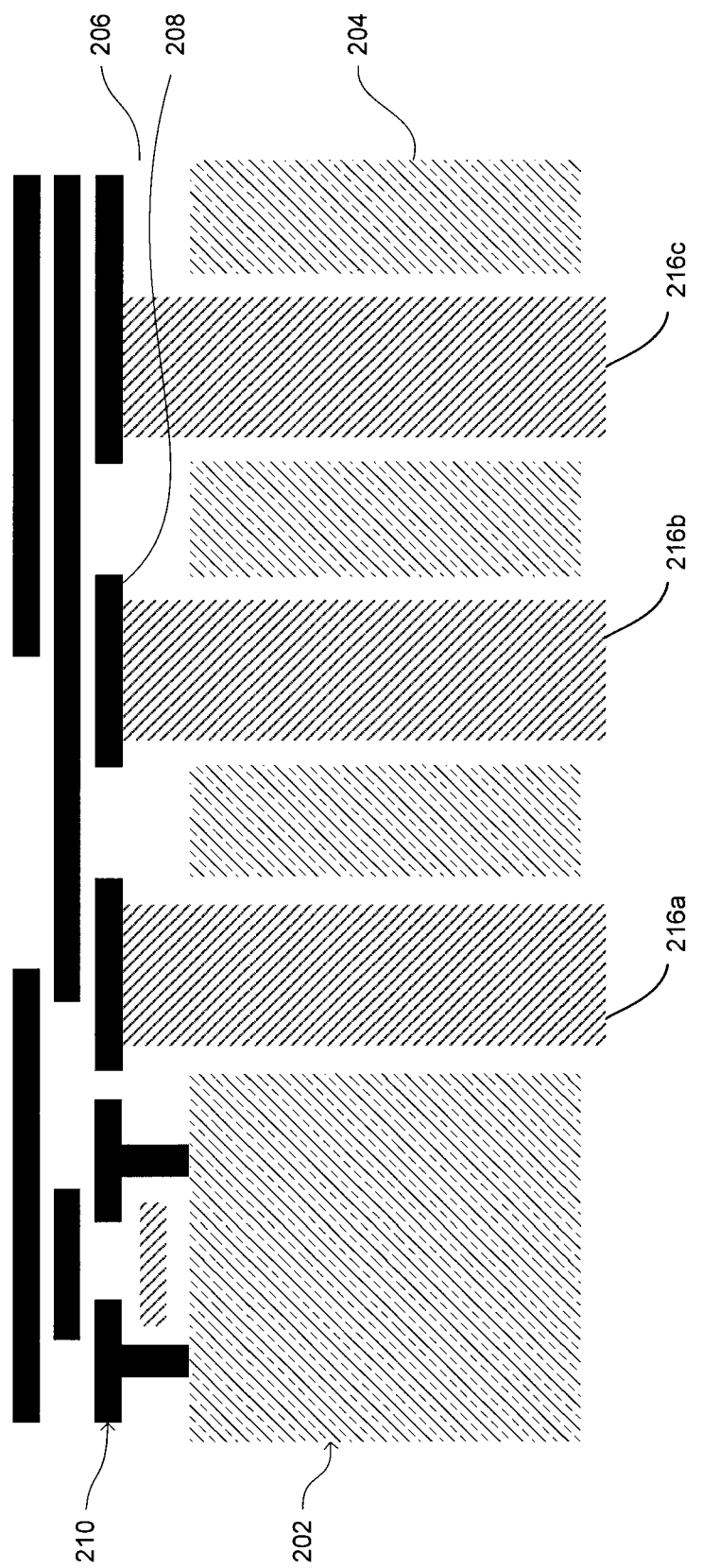

The MEMS device 200, illustratively being a MEMS inductor, is created by forming an inductor within the trenches extending at this point in the fabrication process through the silicon layer 204 to the exposed portions of the metal 208 within the oxide layer 206. More particularly, as illustrated in FIG. 2e, a conductor 216a-c comprising, for example, copper is electrodeposited within each of the exemplary trenches 205a-c.

If the metal 208 within the oxide layer 206 is aluminum, then the surface of the aluminum can during fabrication form a thin aluminum oxide layer that can prevent electrodeposition of a metal such as copper. Thus, according to yet another embodiment, the fabrication process further includes pretreating the exposed portion of the metal prior to electrodepositing each conductor 216a-c. More particularly, the pretreating can comprise, for example, a zincate pre-treatment. A zincate is a known salt of zinc hydroxide, such as $Zn(OH)_2$. Treating the exposed portion of the metal 208 with a zincate forms a thin layer of zinc over the exposed portion of the metal. A metal such as copper adheres well to this thin layer of zinc. Thus, if the conductor 216a-c is formed by electrodepositing copper within each exemplary trench, the pre-treatment of the exposed portion of the metal 208 with a zincate can facilitate adhesion of each conductor 216a-c within each trench 205a-c.

The thickness of each conductor 216a-c formed by electrodepositing can vary. According to one embodiment, the thickness varies within a range of approximately 20 μm to approximately 250 μm.

Figure 2F:
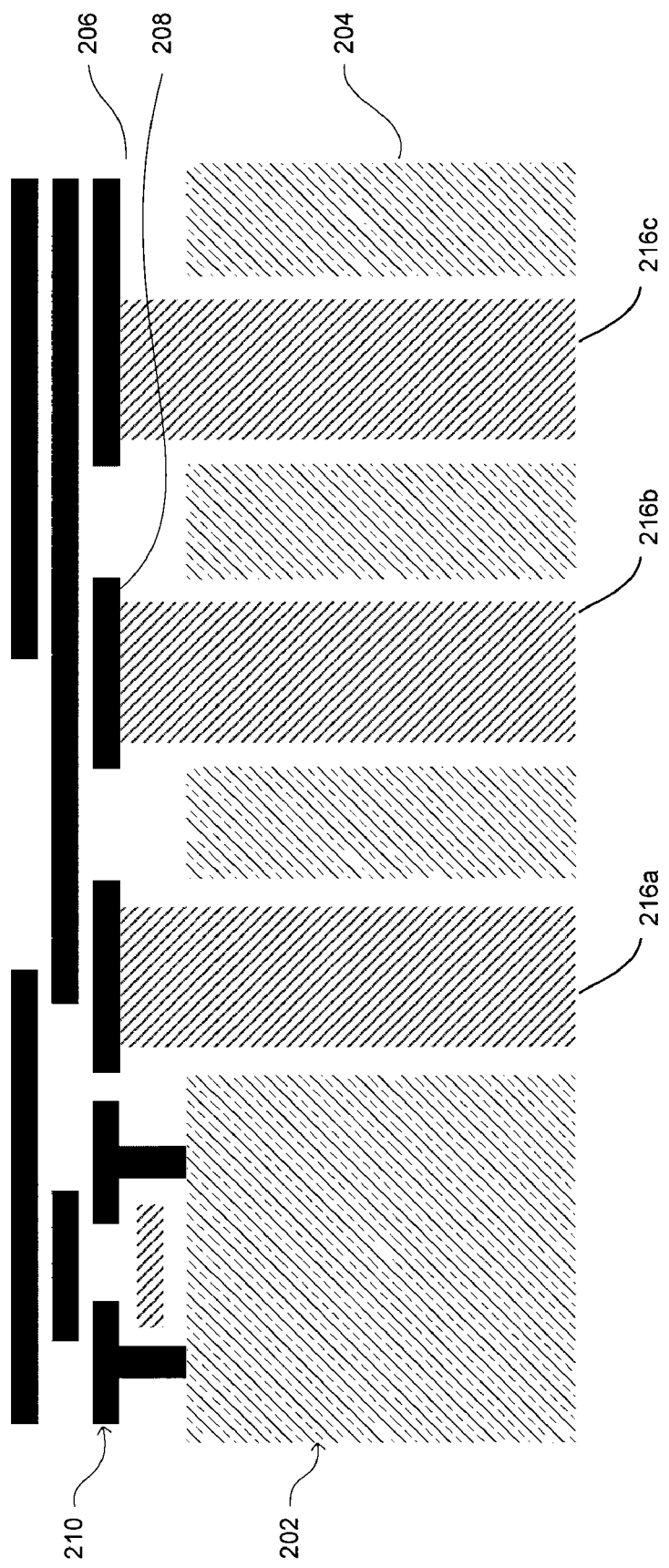

At this point, the fabrication process can result in irregularities on the surface of the MEMS device 200. Thus, optionally, the fabrication can further include at this point planarizing the exposed surface of the silicon layer 204 and the exposed portions of the conductor 216a-c formed in the exemplary trenches, as illustrated in FIG. 2f. The planarization can be effected using chemical-mechanical polishing (CMP), as will be readily understood by one of ordinary skill in the art.

Figure 2G:
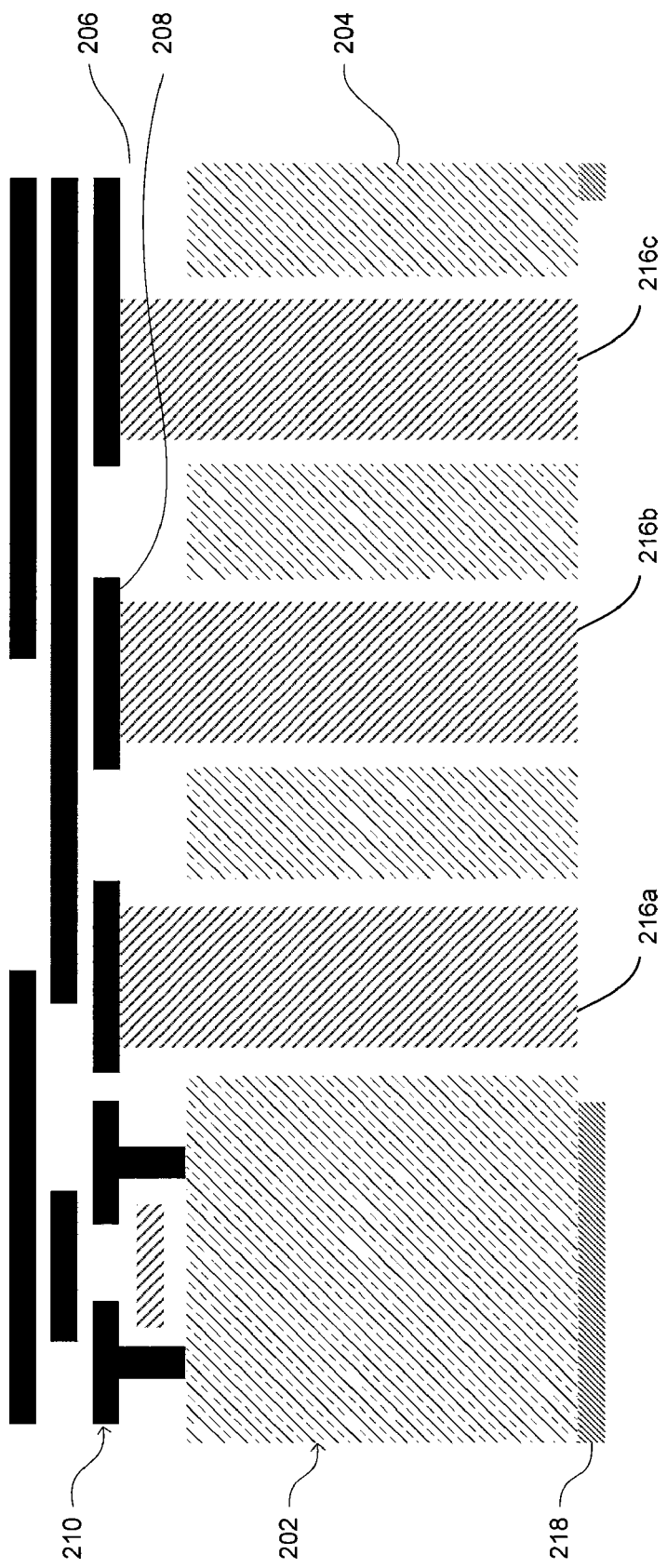

As illustrated in FIG. 2g another photoresist 218 is deposited on portions of the surface of the silicon layer 204, leaving only the region in which the conductors 216a-c are formed and portions of the silicon layer adjacent thereto exposed. More particularly, the photoresist layer can be deposited by spinning the photoresist onto the portions of the surface of the silicon layer 204 as shown.

Figure 2H:
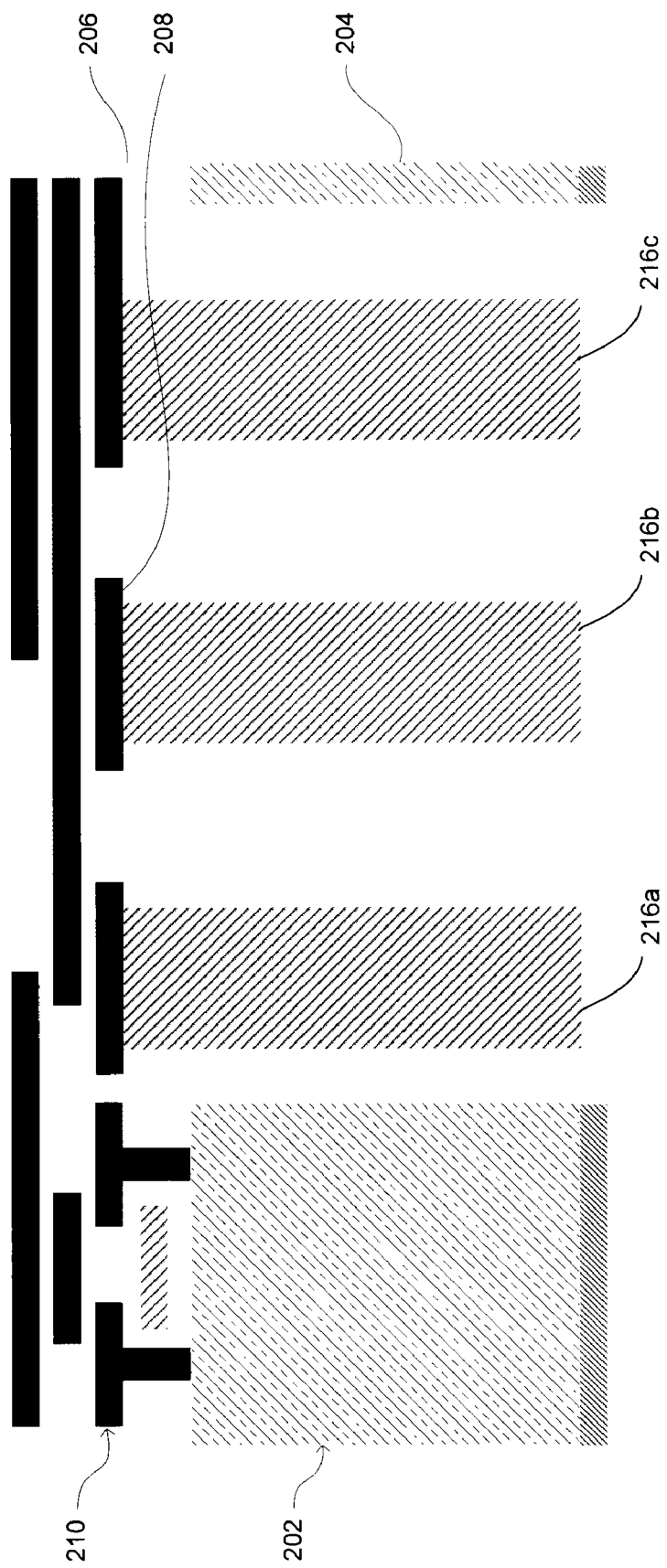

As further illustrated in FIG. 2h, the exposed portion of the silicon layer 204 is etched down to the oxide layer 206, and the photoresist is then removed. Again, according to one embodiment, the exposed portion of the silicon layer 204 is removed by deep reactive ion etching (DRIE), and, according to yet another embodiment, the photoresist is removed with oxygen plasma. The result is a conductor within each of the exemplary trenches, the resulting conductors forming a spiral inductor that is suspended over a membrane comprising the oxide layer 204 and the at least one layer of metal 208 embedded therein. The one or more layers of metal 208 can serve as electrical "wiring" or connections, and will have been provided during the fabrication of the CMOS from which the MEMS device 200 is formed. It will be readily appreciated that the present invention pertains to other winding geometries and layouts, as well. The one described herein are merely by way of example to demonstrate the applicability of the underlying processes.

Since, as already described, each conductor 216a-c formed in the exemplary trenches can be relatively thick, the resulting MEMS device 200 is further characterized by low series resistance corresponding to a high Q factor and a high current-carrying capacity.

Figure 3:
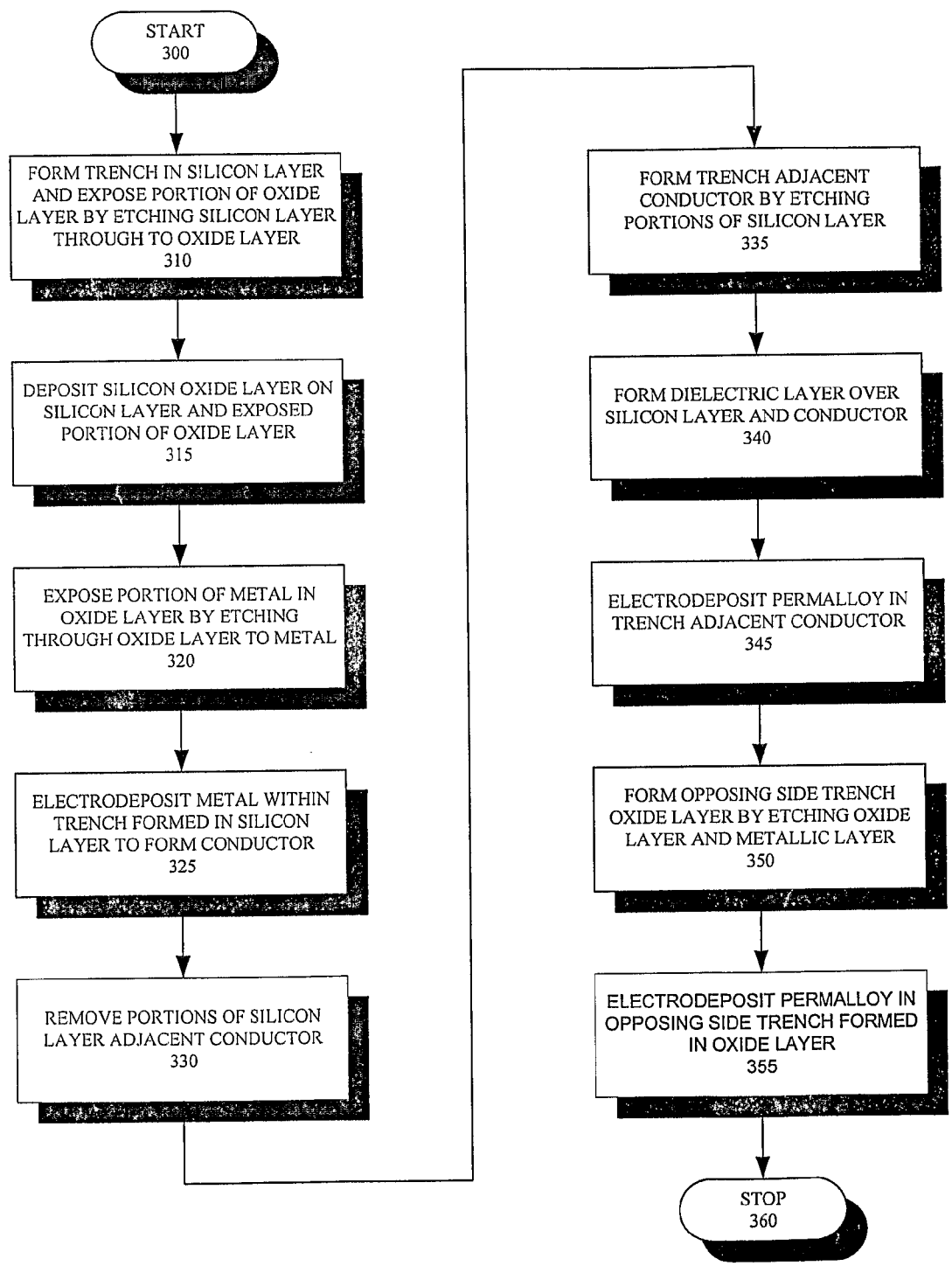
FIG. 3 is a flowchart illustrating a method of fabricating a MEMS device, according to still another embodiment of the present invention.

Referring now to FIG. 3, a flowchart is provided that illustrates the steps in a method of MEMS device according to still another embodiment of the present invention. The MEMS device illustratively comprises a MEMS inductor having a magnetic core of either the spiral type or meander type or solenoid type. Again, as previously noted, the MEMS device according to the invention encompasses other core geometries and layouts, as will be readily understood by one of ordinary skill in the art. The MEMS, again, is fabricated from a complementary metal oxide semiconductor (CMOS) having a silicon layer and an oxide layer, the oxide layer being disposed on the silicon layer and having at least one metal layer disposed therein.

The method 300 illustratively includes, at step 310, etching the silicon layer of the CMOS to form a trench through the silicon layer to expose a portion of the oxide layer, and, at step 315, depositing a silicon oxide layer on the silicon layer and exposed portion of the oxide layer within the trench. The method 300 further illustratively includes etching the silicon layer deposited on the exposed portion of the oxide layer to expose a portion of the metal disposed within the oxide layer at step 320. At step 325, the method illustratively includes electrodepositing a conductor within the trench, the conductor extending through the trench to the exposed portion of the metal, and, at step 330, etching the silicon layer of the CMOS to remove portions of the silicon layer adjacent the conductor.

As illustrated, the method 300 further includes at step 335 etching portions of the oxide layer adjacent the conductor to form at least one trench adjacent the conductor defined by sidewalls of the silicon layer on which a layer of oxide remains deposited. At step 340, the method illustratively includes forming a dielectric layer over the silicon layer and conductor. Additionally, the method includes electrodepositing a permalloy within the at least one trench adjacent the conductor at step 345. At step 350, the method illustratively includes etching the oxide layer to form a trench in a side of the oxide layer opposite the side in which the at least one trench adjacent the conductor is formed to thereby form an opposing side trench, and at step 355, the method illustratively concludes with the electrodepositing in the opposing side trench a permalloy.

Figure 4A:
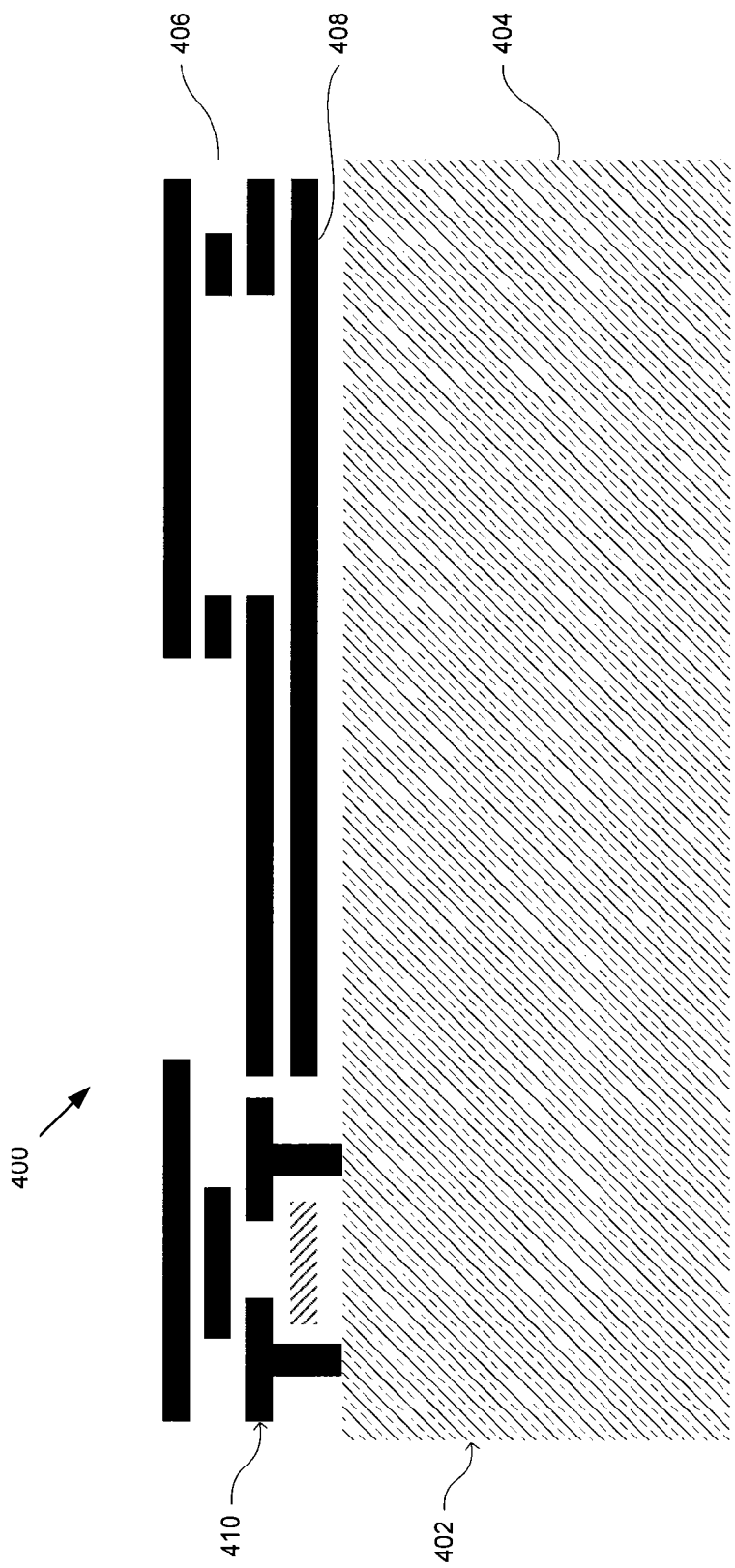
FIGS. 4a-n are schematic diagrams of a cross-sectional portion of a CMOS transformed into a MEMS device, according to yet another embodiment of the present invention.

Referring additionally now to FIGS. 4a-n, the structure of a MEMS device 400 is illustrated at various points during the process of its fabrication, according to still another embodiment of the present invention. The MEMS device 400 is illustratively MEMS inductor having a magnetic core of either the spiral type or meander type.

FIG. 4a illustrates the CMOS 402 from which the MEMS device 400 is fabricated. As described above, the CMOS 402 illustratively includes a silicon layer 404, an oxide layer 406 disposed on the silicon layer, and at least one layer of a metal 408 disposed within the oxide layer. The metal 408 of the at least one layer within the oxide layer 406, again, can comprise aluminum, for example. Only one transistor 410 of the CMOS is shown, it being understood that the illustrated transistor can be either an N-channel or P-channel transistor and that the CMOS includes a complementary transistor (not shown).

Figure 4B:
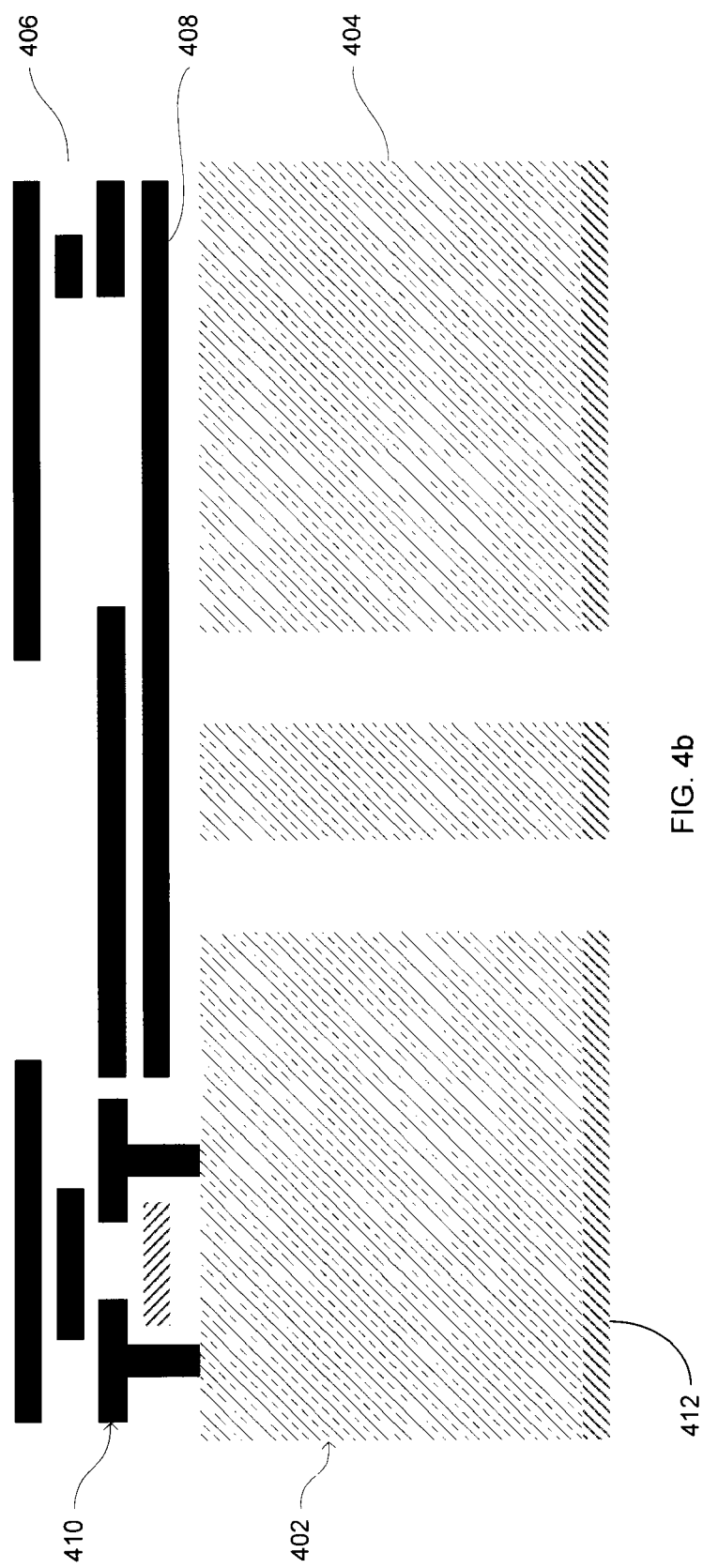
Figure 4C:
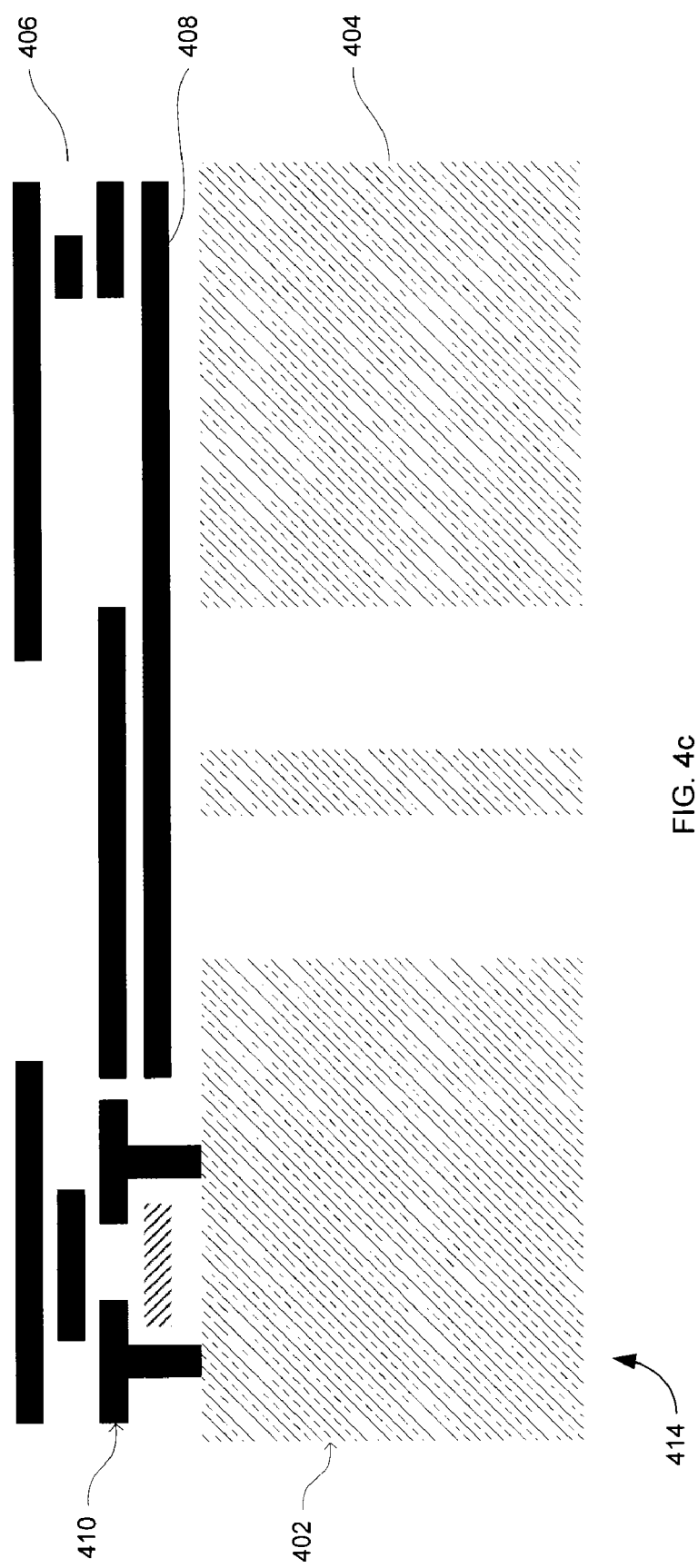

As illustrated in FIG. 4b, the fabrication of the MEMS device 400 begins with the formation of one or more trenches 405a, 405b in the silicon layer 404 of the CMOS 402 by, for example, deep trench silicon etching from the exposed surface of the silicon layer through to the oxide layer 406. The positioning of the one or more trenches, again, can be dictated by an etching mask illustratively comprising a photoresist 412 applied to the exposed surface of the silicon layer 404. The fabrication continues with the removal of the photoresist 412 and the deposition of a silicon dioxide layer 414 as illustrated in FIG. 4c. The deposition can be accomplished, for example, through plasma-enhanced chemical vapor deposition (PECVD).

Figure 4D:
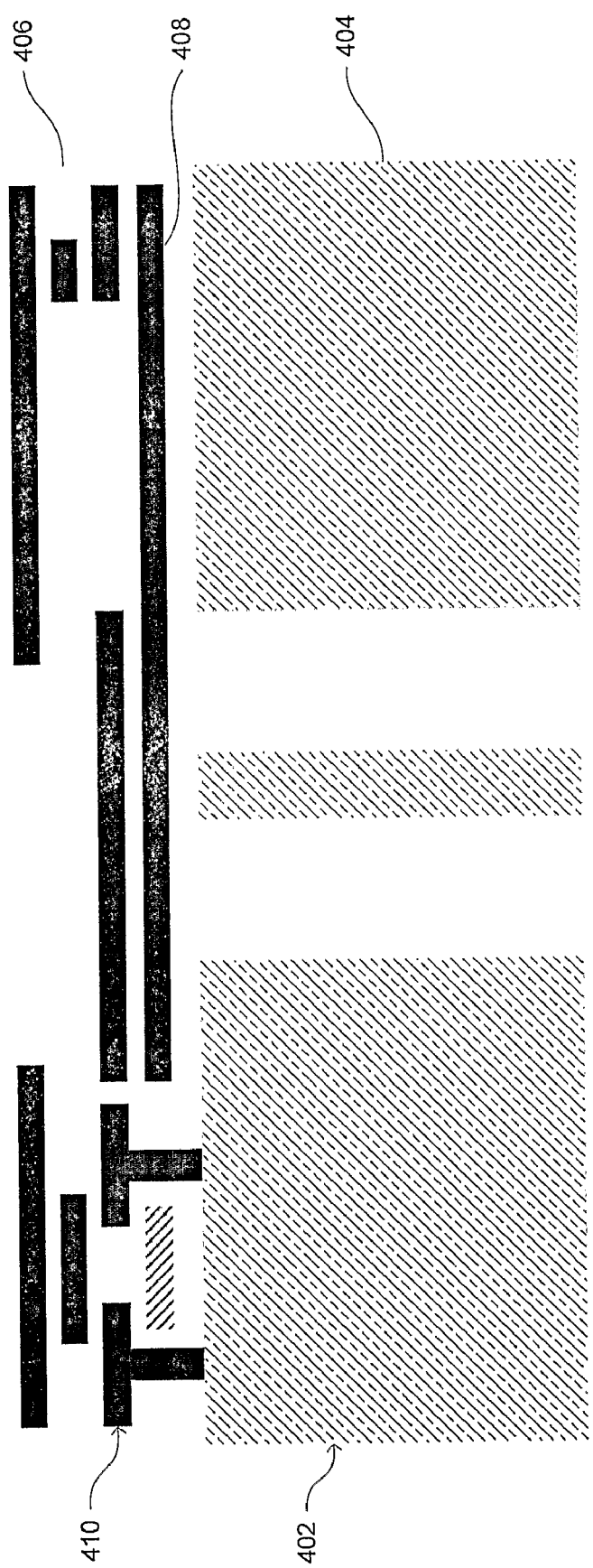
Figure 4E:
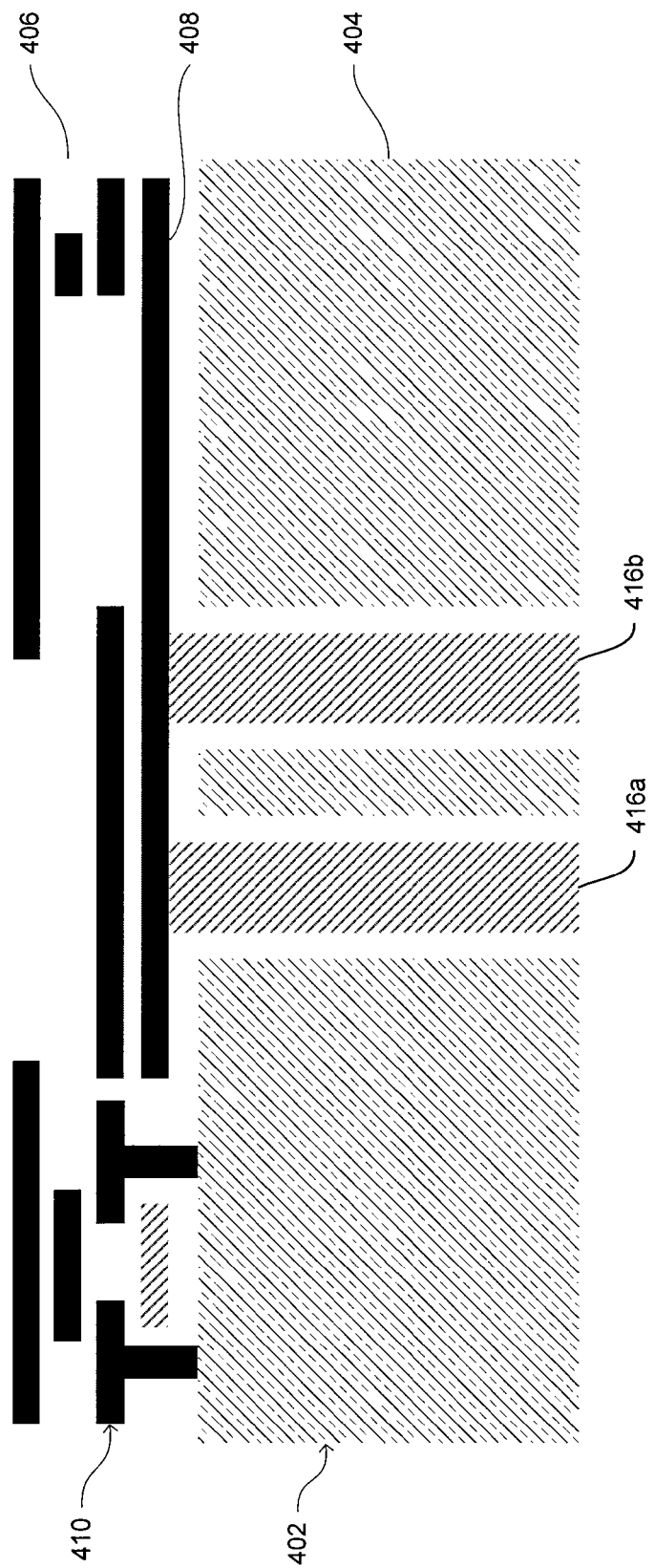

Portions of the oxide layer 406 overlying portions of the metal 408 at the distal ends of the exemplary trenches are etched to expose the portions of the metal, as illustrated in FIG. 4d. This step in the fabrication can be accomplished, for example, by removing the portions of the oxide layer 406 within the one or more trenches through anisotropic dielectric etching. As illustrated in FIG. 4e, at least one conductor 416a, 416b is formed in each trench by electrodepositing a metal such as copper therein. A planarization of the exposed surface of the silicon layer 404 and exposed portions of each conductor 416a, 416b optionally can be performed to eliminate or mitigate surface irregularities as already described and as further illustrated in FIG. 4e.

Figure 4F:
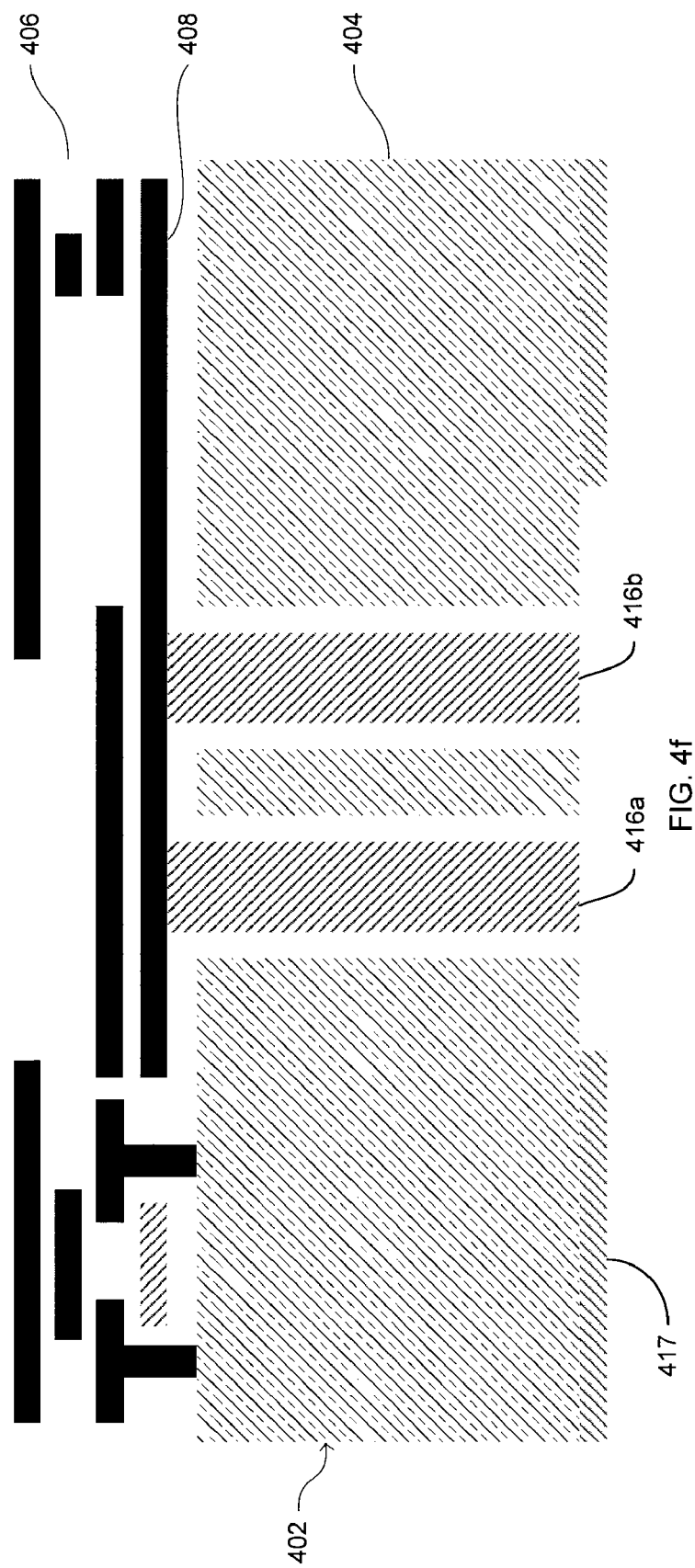
Figure 4G:
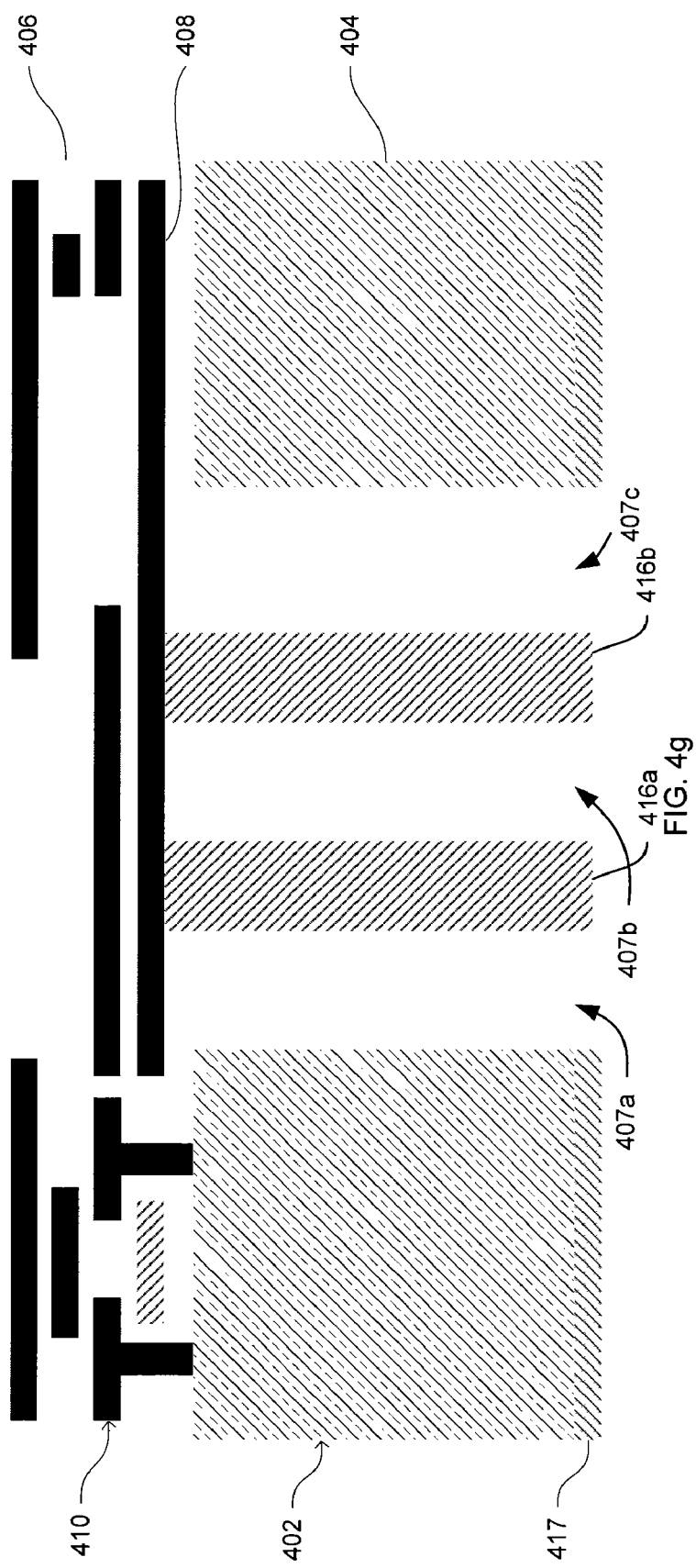

As illustrated in FIG. 4f another photoresist 417 is deposited on portions of the exposed surface of the silicon layer 404 such that only the region in which each conductor 416a, 416b is formed and portions of the silicon layer adjacent thereto are exposed. More particularly, the photoresist layer can be deposited by spinning the photoresist onto the portions of the surface of the silicon layer 404 as shown in FIG. 4f. The exposed portion of the silicon layer 404 is then etched down to the oxide layer 406, as illustrated in FIG. 4g. The result is a formation of three new open trenches 407a-c. Next, the photoresist is then removed. Again, according to one embodiment, the new open trenches 407a-c can be formed by removing the exposed portion of the silicon layer 404 by deep reactive ion etching (DRIE). According to yet another embodiment, the photoresist is removed with oxygen plasma.

Then an anisotropic oxide etch is performed to expose portions of metal 408, followed by a metal etch to expose the open trenches to the oxide layer 406. The result is a conductor 416a, 416b within each of the earlier-formed trenches 405a, 405b, the resulting conductors forming an inductor suspended over a membrane comprising the oxide layer 406 and the at least one layer of metal 408 embedded in the oxide layer as shown in FIG. 4h.

Figure 4I:
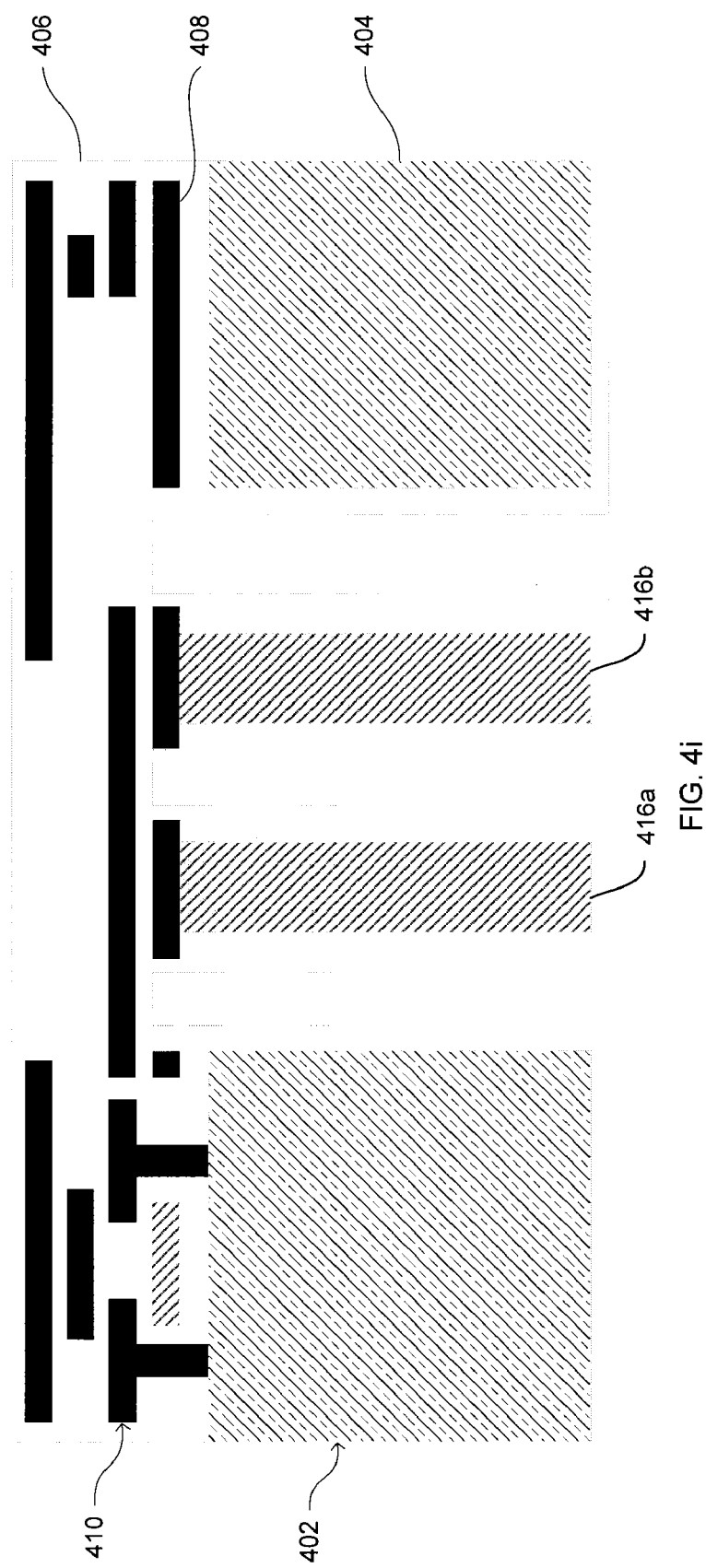
Figure 4J:
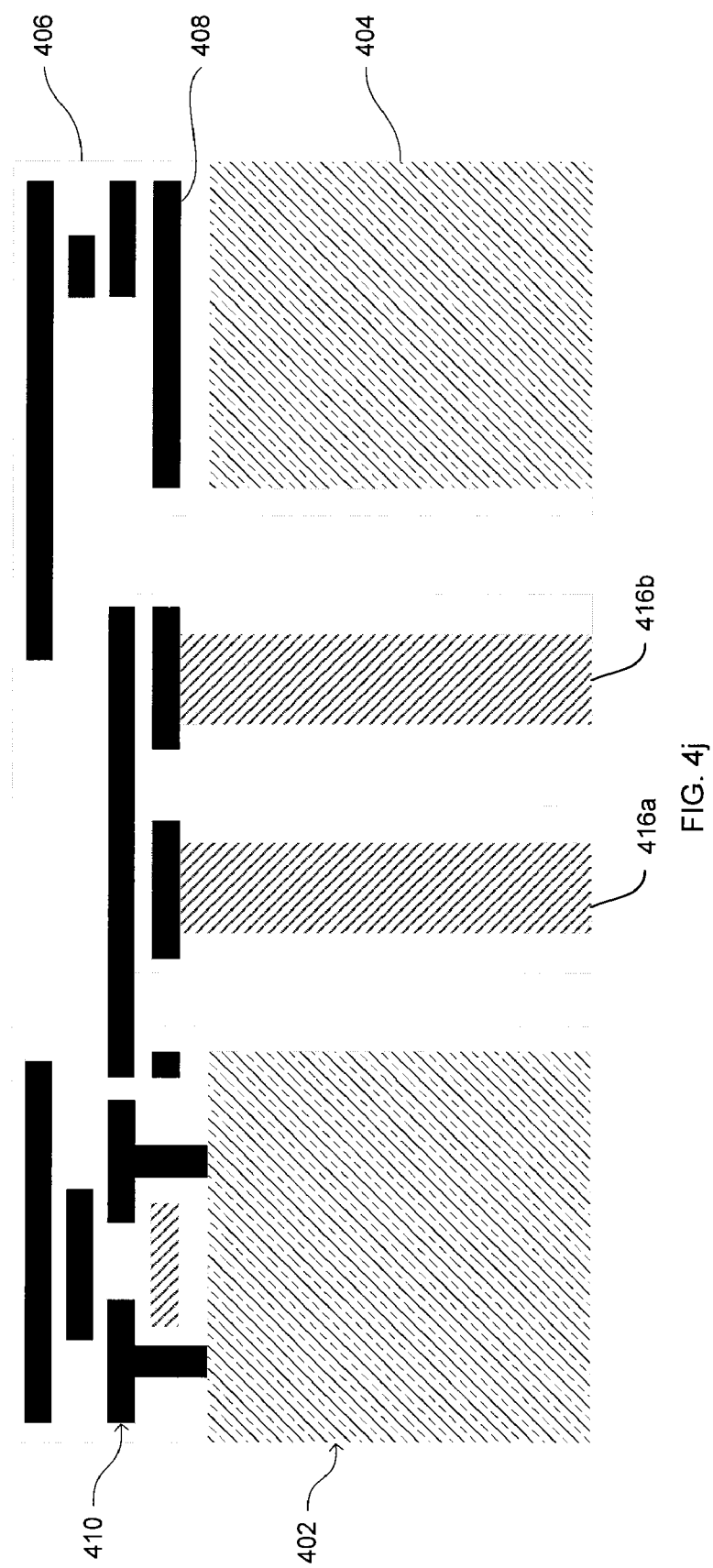
Figure 4K:
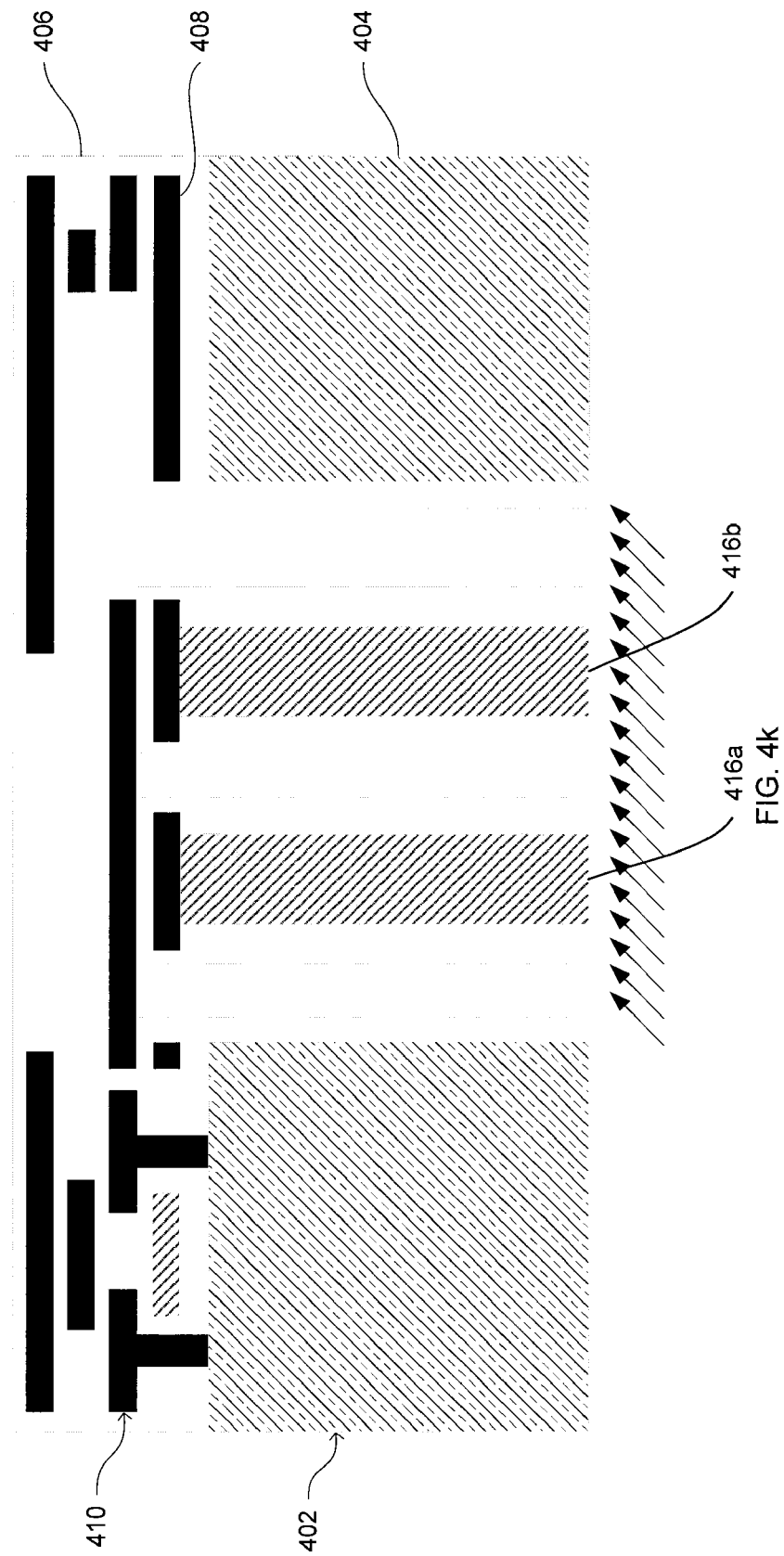
Figure 4I:
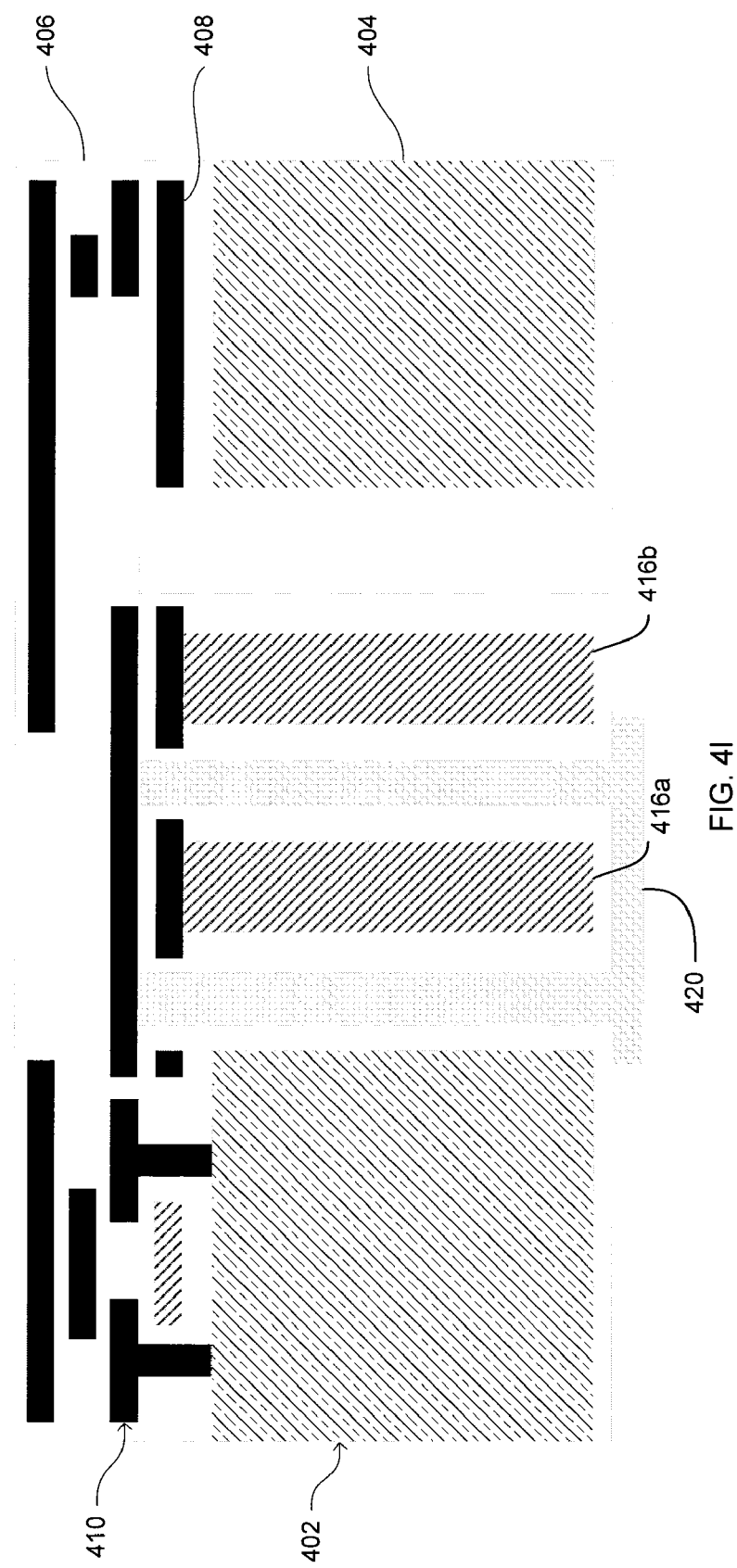

A dielectric layer is then deposited on the exposed surface of the silicon layer 404, the sidewalls around the later-formed open trenches 407a,-c, and each conductor 416a, 416b as shown in FIG. 4i. Then an anisotropic dielectric etch is performed to expose the metal 408 in the open trenches as shown in FIG. 4j. Note that as illustrated, there is no metal at the bottom of the right-most open trench 407c, which is used to form an optional air gap for a magnetic core or for reducing substrate loss. More particularly, according to one embodiment, the dielectric layer can comprise silicon oxide. Next, one dielectric layer such as silicon dioxide is sputtered at a predetermined angle relative to the silicon layer 404 to passivate the surfaces of silicon layer 404 and each conductor 416a, 416b, while still leaving exposed the portions of metal 408 at the distal ends of the left-most and center open trenches 407a, 407b, as illustrated in FIG. 4k.

A permalloy 420 is then formed by electrodepositing a permalloy within at least one trench formed in the silicon layer 404 adjacent the conductor, as illustrated in FIG. 4l. More particularly, the electrodepositing of the permalloy can include electrodepositing a metallic seed layer on exposed portions of the metal within the trench adjacent the conductor, pre-treating the metallic seed layer, and electrodepositing the permalloy on the pre-treated metallic seed layer. According to one embodiment, the metallic seed layer comprises copper and/or gold. According to yet another embodiment, the pre-treating comprises a zincate process to form a thin zinc layer on the exposed portions of the metal within the trench adjacent the conductor.

Figure 4M:
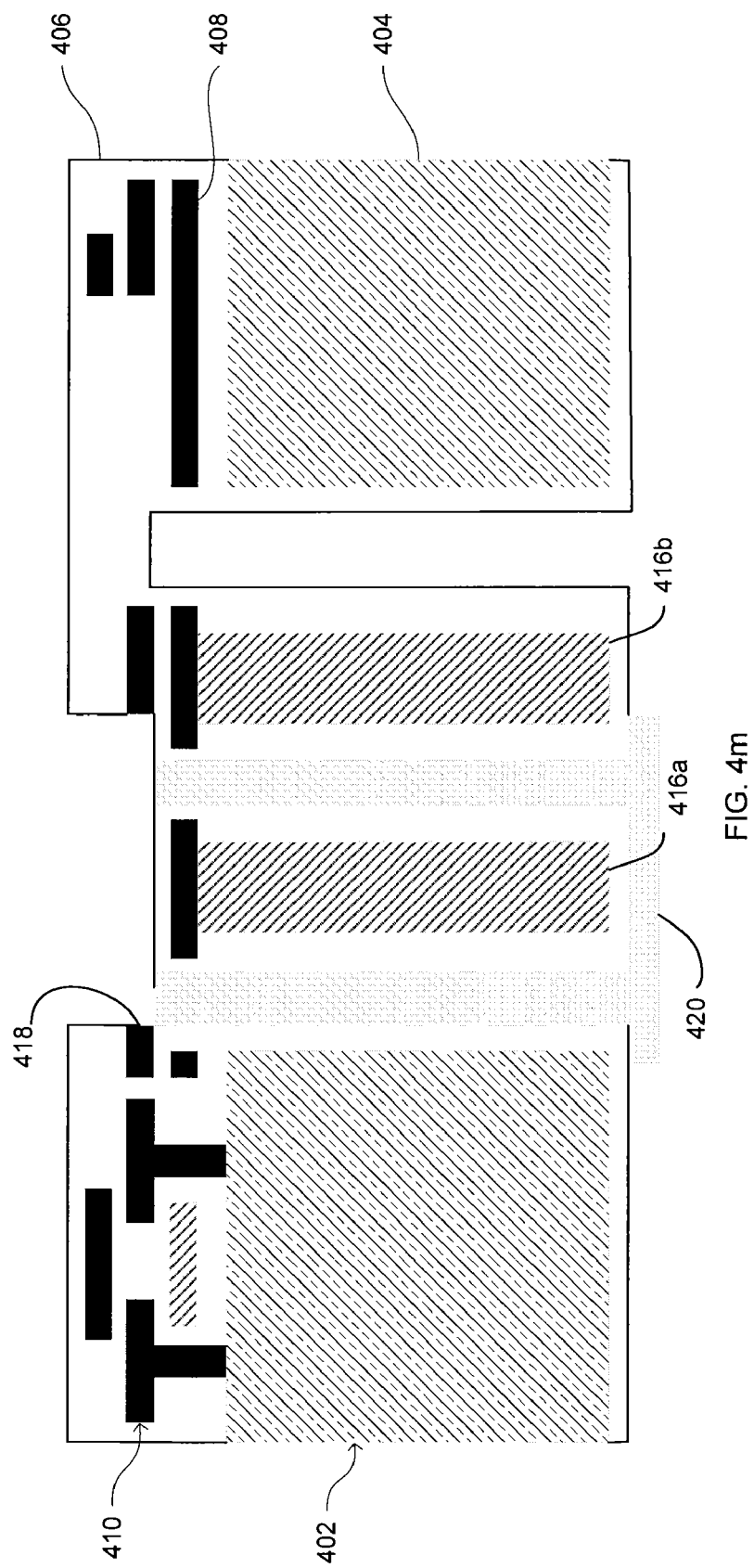

As illustrated in FIG. 4m, the exposed side of the oxide layer 406 is then etched through to another metal layer 418 illustratively disposed within the oxide layer. Subsequently, the exposed portion of the metal layer 418 is removed by using, for example, $Cl_2/BCl_3$ based RIE dry etch. The result is an opposing side trench. Then, within the opposing side trench, the permalloy is electrodeposited, as shown is FIG. 4n. Note that the permalloy forms a layer that expands laterally such that any adjacent permalloy regions can merge together.

The MEMS device 400 so formed can be characterized as solid and robust, having a high aspect ratio, low series resistance, and high Q factor. It also exhibits high power capability and has a controllable air gap. Such a device is suitable for providing an inductor having a magnetic core of various types, including the spiral type, meander type and solenoid type.

According to another embodiment of the present invention, a MEMS device is similarly formed from a CMOS, save for one exception. Instead of electrodepositing a conductor first, the permalloy is electroplated first and then the conductor depositions are performed in places the permalloy has previously been deposited.

The MEMS devices thus formed can also be characterized as being solid and robust, with a high aspect ratio, low series resistance, and high Q factor. The device likewise exhibits high power capability and has an air gap for controlling an effective permeability. The device is suitable for providing a solenoid-type inductor and/or transformer with a closed magnetic core or magnetic core with a gap. There can be more than one lumped gap, or, alternatively, a large number of distributed gaps.

According to still another embodiment of the present invention, a MEMS device is similarly formed from a CMOS, but instead of electrodepositing the magnetic core (i.e., permalloy), the magnetic core depositions are replaced by second conductor depositions. The two conductors can be used for example to form integrated capacitors with large capacitance.

This invention can be embodied in other forms without departing from the spirit or essential attributes thereof. Accordingly, reference should be made to the following claims, rather than to the foregoing specification, as indicating the scope of the invention.

The invention claimed is:

1. A method of fabricating a micro-electromechanical system (MEMS) device from a complementary metal oxide semiconductor (CMOS) having a silicon layer and an oxide layer, the oxide layer being disposed on the silicon layer and having at least one metal layer disposed therein, the method comprising:

etching the silicon layer of the CMOS to form a trench through the silicon layer to expose a portion of the oxide layer;

depositing a silicon oxide layer on the silicon layer and exposed portion of the oxide layer within the trench;

etching the silicon oxide layer deposited on the exposed portion of the oxide layer to expose a portion of the metal disposed within the oxide layer;

electrodepositing a conductor within the trench, the conductor extending through the trench to the exposed portion of the metal;

etching the silicon layer of the CMOS to remove portions of the silicon layer adjacent the conductor;

depositing a silicon dioxide layer over the silicon layer and the conductor; and etching portions of the oxide layer adjacent the conductor to form at least one trench adjacent the conductor defined by sidewalls of the silicon layer on which a layer of oxide remains deposited.

2. The method of claim 1, further comprising pre-treating the exposed portion of the metal prior to electrodepositing the conductor.

3. The method of claim 2, wherein pre-treating comprises treating the exposed portion of the metal to form an adhesion layer over the exposed portion of the metal.

4. The method of claim 1 further comprising planarizing the silicon layer after electroplating the conductor.

5. The method of claim 1, wherein etching the silicon layer of the CMOS to remove portions of the silicon layer adjacent the conductor comprises depositing a photoresist layer on portions of the silicon layer spaced apart from the conductor, etching exposed portions of the silicon layer adjacent the conductor, and removing the photoresist layer.

6. The method of claim 5, wherein depositing the photoresist layer on portions of the silicon layer spaced apart from the conductor comprises spinning a photosensitive material onto portions of the silicon layer, and wherein the photoresist layer is removed using an oxygen plasma applied after etching exposed portions of the silicon layer adjacent the conductor.

7. The method of claim 1, wherein etching the silicon layer of the CMOS to form a trench through the silicon layer to expose a portion of the oxide layer and etching the silicon layer of the CMOS to remove portions of the silicon layer adjacent the conductor each comprise a deep reactive ion etching.

8. The method of claim 1, wherein etching the silicon oxide layer deposited on the exposed portion of the oxide layer comprises an anisotropic dielectric etching.

9. A method of fabricating a micro-electromechanical system (MEMS) device from a complementary metal oxide semiconductor (CMOS) having a silicon layer and an oxide layer, the oxide layer being disposed on the silicon layer and having a metal disposed therein, the method comprising:

etching the silicon layer of the CMOS to form a trench through the silicon layer to expose a portion of the oxide layer;

depositing a silicon oxide layer on the silicon layer and exposed portion of the oxide layer within the trench;

etching the silicon oxide layer deposited on the exposed portion of the oxide layer to expose a portion of the metal disposed within the oxide layer;

electrodepositing a conductor within the trench, the metal core extending through the trench to the exposed portion of the metal;

etching the silicon layer of the CMOS to remove portions of the silicon layer adjacent the conductor;

depositing a silicon dioxide layer over the silicon layer and the conductor;

etching portions of the oxide layer adjacent the conductor to form at least one trench adjacent the conductor defined by sidewalls of the silicon layer on which a layer of oxide remains deposited;

forming a dielectric layer over the silicon layer and the conductor;

electrodepositing a permalloy within the at least one trench adjacent the conductor;

etching the oxide layer to form a trench in a side of the oxide layer opposite the side in which the at least one trench adjacent the conductor is formed to form an opposing side trench; and electrodepositing in the opposing side trench a permalloy.

10. The method of claim 9, wherein forming the dielectric layer comprises sputtering a dielectric layer at a predetermined angle relative to at least one of the silicon layer and conductor.

11. The method of claim 9, wherein electrodepositing a permalloy within the at least one trench adjacent the conductor comprises:

electrodepositing a metallic seed layer on exposed portions of the metal within the trench adjacent the conductor;

pre-treating the metallic seed layer; and electrodepositing a permalloy on the pre-treated metallic seed layer.

12. The method of claim 11, wherein pre-treating comprises depositing an adhesion layer on the exposed portions of the metal within the trench adjacent the conductor.

13. The method of claim 1, further comprising:

electrodepositing a permalloy within the at least one trench adjacent the conductor.

14. The method of claim 13, further comprising:

etching the oxide layer to form a trench in a side of the oxide layer opposite the side in which the at least one trench adjacent the conductor is formed to form an opposing side trench.

15. The method of claim 14, further comprising:

electrodepositing in the opposing side trench a permalloy.

* * * * *